(12) United States Patent
Park

(10) Patent No.: US 7,008,847 B2
(45) Date of Patent: Mar. 7, 2006

(54) SEMICONDUCTOR DEVICE HAVING ELECTRICALLY ERASABLE PROGRAMMABLE READ-ONLY MEMORY (EEPROM) AND MASK-ROM AND METHOD OF FABRICATING THE SAME

(75) Inventor: Weon-Ho Park, Suwon-shi (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 155 days.

(21) Appl. No.: 10/440,238

(22) Filed: May 19, 2003

(65) Prior Publication Data
US 2004/0033664 A1    Feb. 19, 2004

(30) Foreign Application Priority Data
Aug. 14, 2002    (KR)    ........................ 10-2002-0048044

(51) Int. Cl.
*H01L 21/336*    (2006.01)
(52) U.S. Cl. ........................ 438/264; 438/294; 438/296
(58) Field of Classification Search ................ 438/264, 438/296, 294
See application file for complete search history.

(56) References Cited

U.S. PATENT DOCUMENTS

| | | | | |
|---|---|---|---|---|
| 5,393,684 | A | | 2/1995 | Ghezzi et al. ............... 438/268 |
| 5,554,551 | A | * | 9/1996 | Hong .......................... 438/261 |
| 6,140,023 | A | * | 10/2000 | Levinson et al. ........... 430/313 |
| 2003/0111684 | A1 | * | 6/2003 | Park ........................... 257/314 |

* cited by examiner

*Primary Examiner*—Bradley K. Smith
(74) *Attorney, Agent, or Firm*—Harness Dickey & Pierce, P.L.C.

(57) ABSTRACT

A semiconductor device including an EEPROM and a Mask-ROM transistor, and methods of fabricating and forming the same, where a device isolation layer may be formed at given regions of a semiconductor substrate to define a cell active region, and a Mask-ROM active region including a channel doped region therein. A channel doped region may be formed within the Mask-ROM active region, and a plurality of Mask-ROM gates may be formed that cross the channel doped region. A Mask-ROM gate insulating layer may be interposed between a Mask-ROM gate and the Mask-ROM active region, and the device isolation layer may have a surface adjacent to the channel doped region that is lower as compared to a surface of the device isolation layer that is not directly adjacent to the channel doped region.

31 Claims, 21 Drawing Sheets

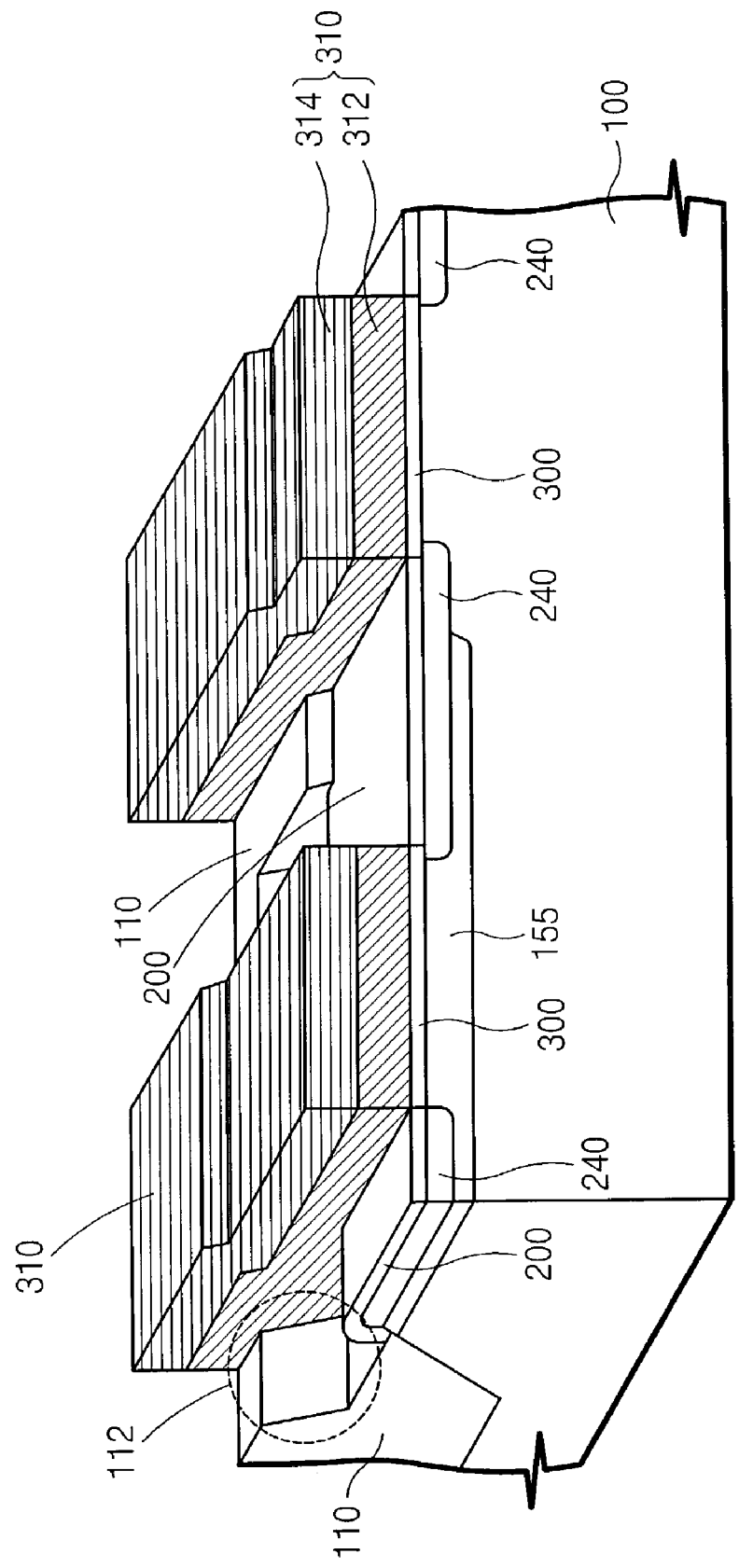

SEMICONDUCTOR DEVICE HAVING ELECTRICALLY ERASABLE PROGRAMMABLE READ-ONLY MEMORY (EEPROM) AND MASK-ROM AND METHOD OF FABRICATING THE SAME

CROSS-REFERENCE TO RELATED CASES

This U.S. nonprovisional patent application claims priority under 35 U.S.C. § 119 of Korean Patent Application 2002-48044 filed on Aug. 14, 2002, the entire contents of which are hereby incorporated by reference.

BACKGROUND OF THE INVENTION

1. Field of the Invention

The present invention relates to a semiconductor device having an EEPROM transistor and a Mask-ROM transistor, and methods of fabricating and forming the same.

2. Description of the Related Art

A smart card may be used as an identification card, as a credit card and as electronic cash. These uses are continuously increasing. The smart card embeds user information and transaction information and simultaneously embeds a program suitable for its purpose. Accordingly, the smart card embeds nonvolatile memory transistors for writing and storing the user information and transaction information, and includes Mask-ROM transistors for coding the program. The nonvolatile memory transistor used in the smart card is an electrically erasable programmable read-only memory (EEPROM) of a floating gate tunnel oxide (FLOTOX) type having a stable characteristic for storing information. Generally, the Mask-ROM transistor is a depletion mode or an enhancement mode Metal-Oxide-Semiconductor Field-Effect-Transistor (MOSFET).

FIGS. 1 through 4 are cross-sectional views for illustrating a prior art method of forming a semiconductor device having conventional EEPROM and Mask-ROM transistors.

Referring to FIG. 1, a device isolation layer 20 is formed at a given region of a semiconductor substrate 10. The device isolation layer 20 defines a cell active region at a cell array region 1 and a Mask-ROM active region at a Mask-ROM region 2. A gate oxide layer 30 is formed on the cell active region and Mask-ROM active region. A first photoresist pattern 40 is formed on a semiconductor substrate where the gate oxide layer 30 is formed. The first photoresist pattern 40 has openings 45 exposing a given region of the cell active region and a given region of the Mask-ROM active region. The opening 45 exposing the cell active region defines a floating doped region, and the opening 45 exposing the Mask-ROM active region defines a channel doped region. An ion implantation process 50 is performed using the first photoresist pattern 40 as an ion implantation mask. Thus, the floating doped region 60 is within the cell active region and the channel doped region 65 is formed within the Mask-ROM active region.

Referring to FIG. 2, the first photoresist pattern 40 is removed, and a second photoresist pattern 70, with an opening 75 exposing the gate oxide layer 30 of the cell active region, is formed on the resultant structure. The opening 75 of the second photoresist pattern 70 exposes the gate oxide layer 30 on the floating doped region 60.

The exposed gate oxide layer 30 in opening 75 is etched using the second photoresist pattern 70 as an etch mask, to expose the floating doped region 60. In FIG. 2, the second photoresist pattern 70 covers an entire surface of the Mask-ROM region 2; thus gate oxide layer 30 and device isolation layer 20 in Mask-ROM region 2 are not etched.

Referring to FIG. 3, after the second photoresist pattern 70 is removed, a tunnel oxide layer 80 may be formed on the exposed floating doped region 60. The tunnel oxide layer 80 is formed using a thermal-oxidizing process on the exposed semiconductor substrate 10, so as to be thinner than gate oxide layer 30.

According to the prior art method, floating doped region 60 and tunnel oxide layer 80 are formed using photoresist patterns 40 and 70, respectively. Thus, a photolithographic process has to be performed two times. Misalignment may occur in a series of the photolithographic processes. If the exact alignment may be defined as an alignment performed within a tolerance limit of a processing variation, the tunnel oxide layer 80 is misaligned to the floating doped region 60 within the tolerance limit of processing variation. The misalignment may cause a non-uniform cell threshold voltage in the EEPROM, where a pair of unit cells is plane-symmetrically arranged. This is further explained below with reference to FIG. 4.

Referring to FIG. 4, after forming the tunnel oxide layer 80, memory and selection gates 92 and 94 are formed to cross over the cell active region. A common source region 85s is formed at the cell active region between a pair of the adjacent memory gates 92. A drain region 85d is formed at the cell active region between a pair of the adjacent selection gates 94. The semiconductor substrate, memory gates 92 and selection gates 94 are covered with an interlayer dielectric 96. A contact/interconnection 98 is connected to the drain region 85d through the interlayer dielectric 96.

At this time, and as described in FIG. 3, the misalignment may occur during the photolithographic processes for forming the floating doped region 60 and the tunnel oxide layer 80. Accordingly, the left cell transistor (to the left of contact/interconnection 98 in FIG. 4) is different from the right cell transistor (to the right of contact/interconnection 98 in FIG. 4) as to a distance between the floating doped region 60 and the common source region 85s (i.e., a channel length of a cell transistor). In other words, $I_L \neq I_R$ in FIG. 4.

Where the EEPROM cell transistors have a plane-symmetrical structure, as may be the case in FIG. 4, for example, harmful side effects resulting from the misalignment may increase. For example, in a case where $\delta$ represents an alignment variation in the processes of forming the floating doped region 60 and the tunnel oxide layer 80, a difference between the left and right channel length of the cell transistors becomes $2\delta$ ($|I_L - I_R| = 2\delta$). In EEPROM cell transistors with plane-symmetrical structure, this difference ($2\delta$) may cause a threshold voltage of the cell transistors to vary, due to band-to-band tunneling (BTBT). Direct band-to-band tunneling current is a leakage current that typically occurs where the bending of the energy band on the semiconductor substrate surface, in the vicinity of the drain region, is larger than the energy band gap of silicon in the drain region. This leakage current is generally influenced in the static mode of the semiconductor device (i.e., stand-by mode) rather than in an operational mode of the semiconductor device, and may cause the aforementioned variance in threshold voltages of the EEPROM cell transistors, for example.

SUMMARY OF THE INVENTION

A feature of the exemplary embodiments of the present invention is to provide a semiconductor device, and methods of fabricating and forming a semiconductor device which may be capable of substantially reducing or preventing a tunnel oxide layer from being misaligned to a floating doped region. Another feature of the exemplary embodiments of the present invention is to provide a method of fabricating or forming a semiconductor device, where forming of a floating doped region and a tunnel oxide layer is done using a single photolithographic process. A further feature of the exemplary embodiments of the present invention is to provide a semiconductor device including EEPROM cell transistors having a plane symmetrical structure.

An exemplary embodiment of the present invention is directed to a semiconductor device including an EEPROM and a Mask-ROM transistor, where, a device isolation layer may be formed at given regions of a semiconductor substrate to define a cell active region and a Mask-ROM active region. A channel doped region may be formed within the Mask-ROM active region, and a plurality of Mask-ROM gates may be formed to cross the channel doped region. A Mask-ROM gate insulating layer may be interposed between a Mask-ROM gate and the Mask-ROM active region, and the device isolation layer may have a surface adjacent to the channel doped region that is lower as compared to a surface of the device isolation layer that is not directly adjacent to the channel doped region.

Another exemplary embodiment is directed to a method of fabricating a semiconductor device, which may include forming a device isolation layer on a semiconductor substrate, with the device isolation layer defining a cell active region and a Mask-ROM active region, and forming a gate insulating layer on the semiconductor substrate and device isolation layer. A first photoresist pattern may be formed on the gate insulating layer, and the first photoresist pattern may including an opening exposing portions of the gate insulating layer. The method further includes forming a floating doped region within the cell active region under the opening by using the first photoresist pattern, exposing the floating doped region using the first photoresist pattern, removing the first photoresist pattern and forming a tunnel insulating layer on the exposed floating doped region.

Another exemplary embodiment is directed to a method of fabricating a semiconductor device, which may include forming a device isolation layer on a semiconductor substrate, with the device isolation layer defining a cell active region at a cell array region and a Mask-ROM active region at a Mask-ROM region, and forming a gate insulating layer on the semiconductor substrate and device isolation layer. A first photoresist pattern may be formed on the gate insulating layer, and the first photoresist pattern may include an opening exposing portions of the gate insulating layer. The method further includes forming a floating doped region within the cell active region and a channel doped region within the Mask-ROM active region with an ion implantation process that uses the first photoresist pattern as a mask, etching the exposed gate insulating layer using the first photoresist pattern as an etch mask to expose the floating doped region and the channel doped region, removing the first photoresist pattern and forming a tunnel insulating layer on the exposed floating doped region. Further, a sense line crossing the cell active region, a selection line crossing the cell active region, and a Mask-ROM gate crossing the Mask-ROM active region may be formed on the semiconductor substrate and tunnel insulating layer.

Another exemplary embodiment is directed to a method of forming a semiconductor device, which may include forming a first insulating layer on the semiconductor substrate and isolation layer, and a photoresist pattern on the first insulating layer, where the photoresist pattern may include an opening exposing portions of the first insulating layer and isolation layer. Further, the method includes forming a floating doped region beneath the opening using the photoresist pattern, etching the floating doped region using first photoresist pattern to form exposed portions, removing the photoresist pattern and forming a second insulating layer on the exposed portions.

Another exemplary embodiment is directed to a semiconductor device where an isolation layer may be formed at given regions of a semiconductor substrate to define a first active region and a second active region. A plurality of gates may cross the second active region, and an insulating layer may be interposed between one of the gates and the second active region. The isolation layer may include a plurality of surfaces, at least some of the plurality of surfaces being at different heights as compared to each other.

BRIEF DESCRIPTION OF THE DRAWINGS

Exemplary embodiments of the present invention will become more fully understood from the detailed description given hereinbelow and the accompanying drawings, wherein like elements are represented by like reference numerals, which are given by way of illustration only and thus are not limitative of exemplary embodiments the present invention and wherein:

FIG. 8B is a perspective view of a Mask-ROM transistor according to another exemplary embodiment of the present invention;

DETAILED DESCRIPTION OF THE EXEMPLARY EMBODIMENTS

Figure 1:
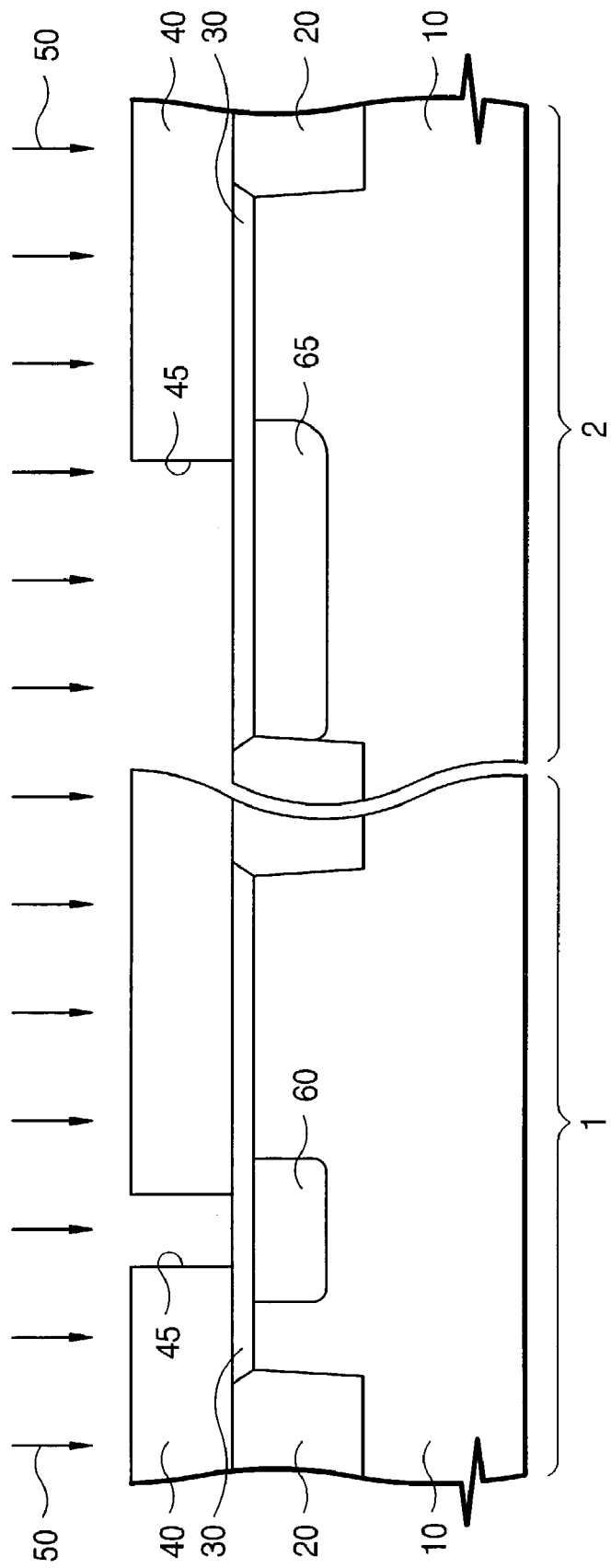
FIGS. 1 through 4 are cross-sectional views illustrating a prior-art method of fabricating a semiconductor device having prior art EEPROM and Mask-ROM transistors.
Figure 2:
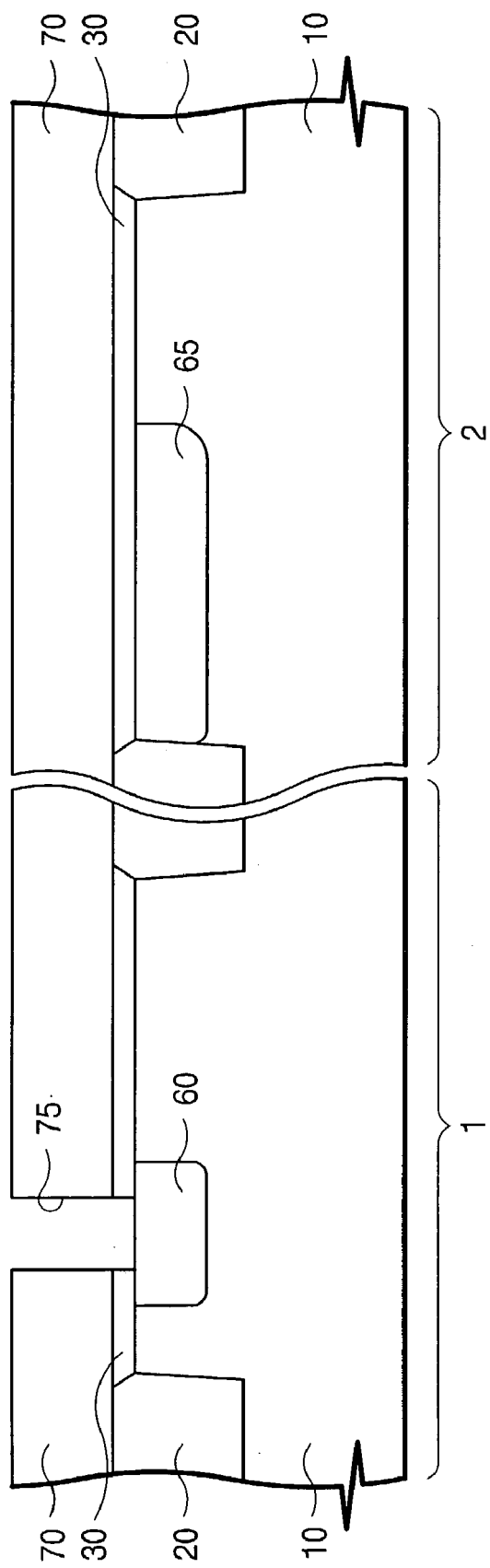
Figure 3:
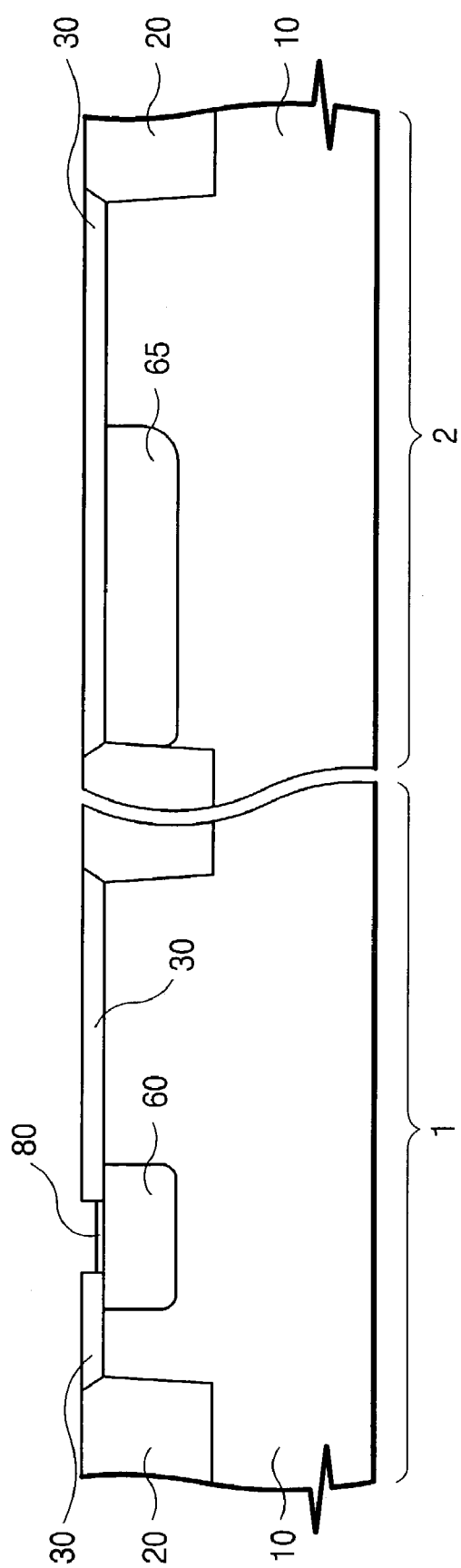
Figure 4:
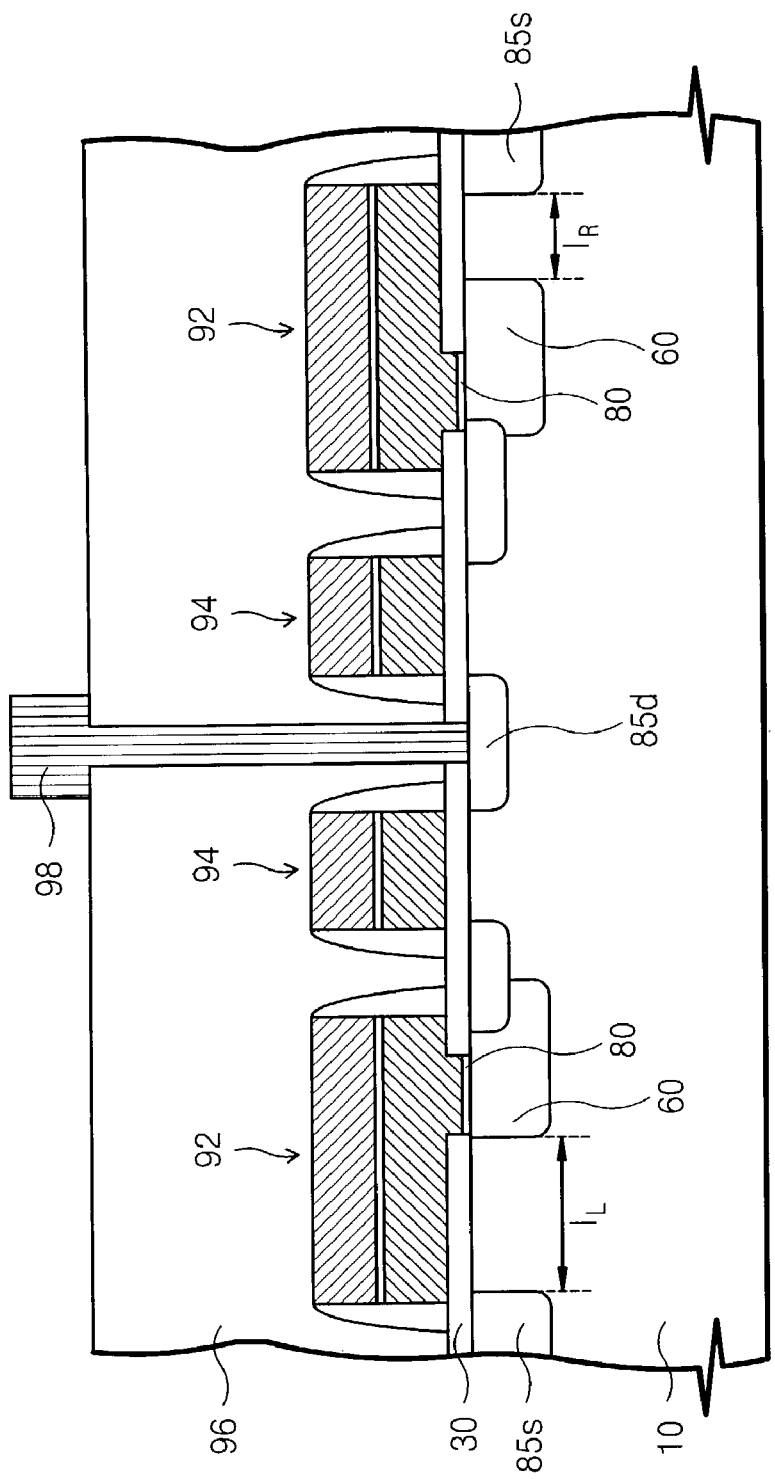

The present invention will now be described more fully hereinafter with reference to the accompanying drawings, in which exemplary embodiments of the invention are illustrated. The exemplary embodiments of the invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art. In the drawings, the thickness of layers and regions are exaggerated for clarity. It should be understood that when a layer is referred to as being "on" another layer or substrate, it can be adjacent, directly on and/or directly adjacent to the other layer or substrate, interposed between layers, or intervening layers may also be present between the layers and the other layer or substrate. Like numbers refer to like elements throughout.

Figure 5:
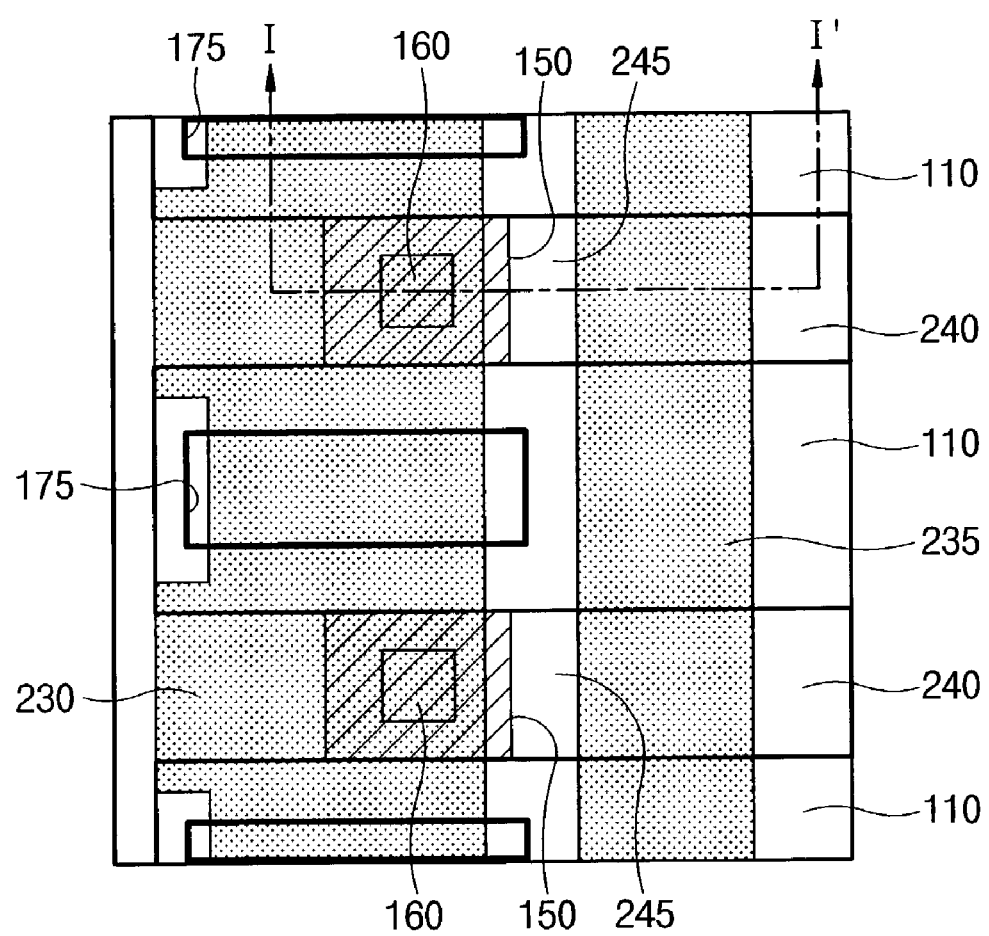
FIG. 5 is a top plan view of an EEPROM transistor structure in accordance with an exemplary embodiment of the present invention.
Figure 6:
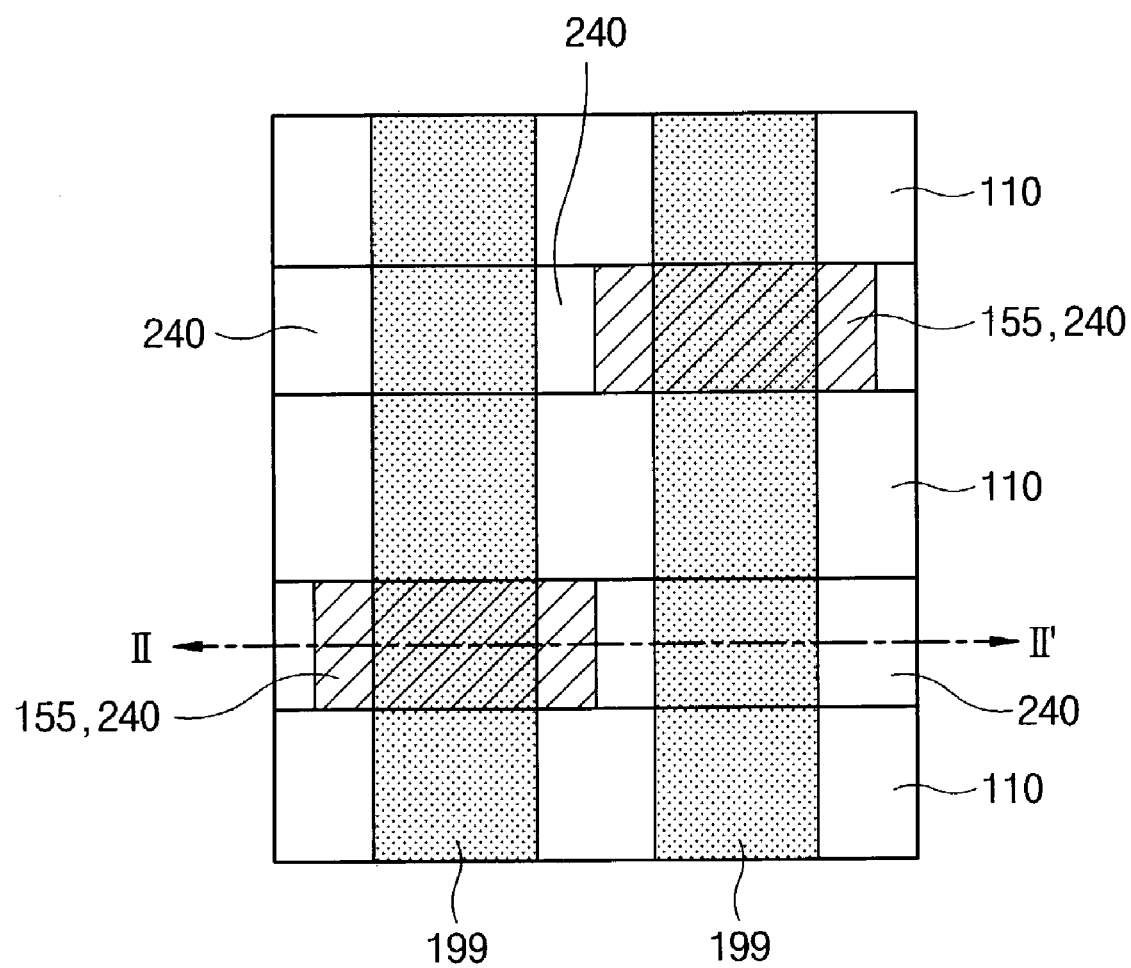
FIG. 6 is a top plan view of a Mask-ROM transistor structure in accordance with an exemplary embodiment of the present invention.
Figure 7:
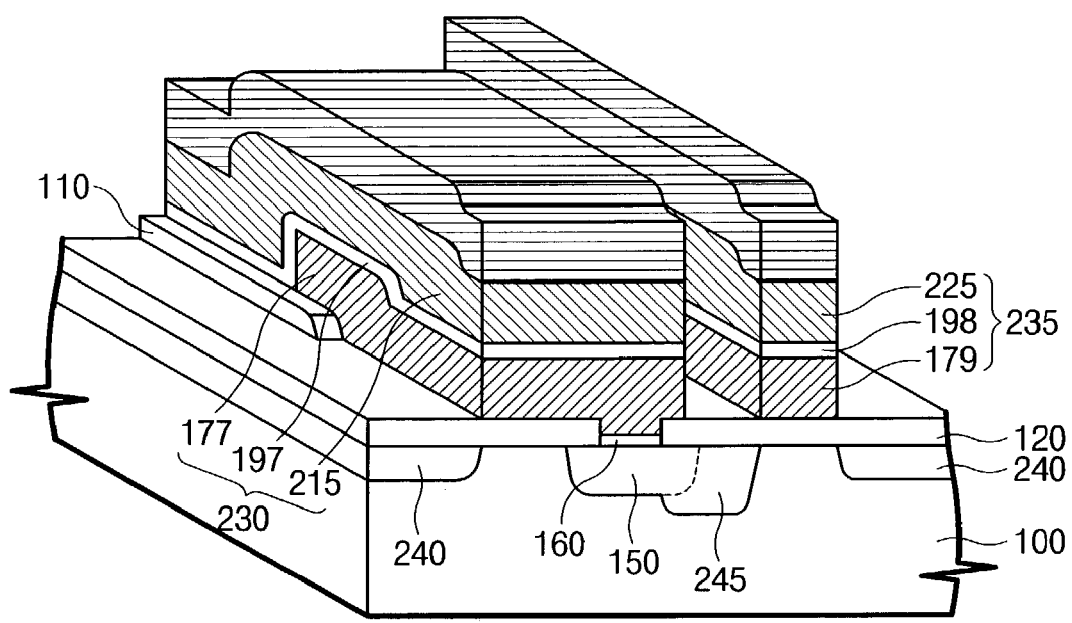
FIG. 7 is a perspective view of an EEPROM transistor according to an exemplary embodiment of the present invention.
Figure 8A:
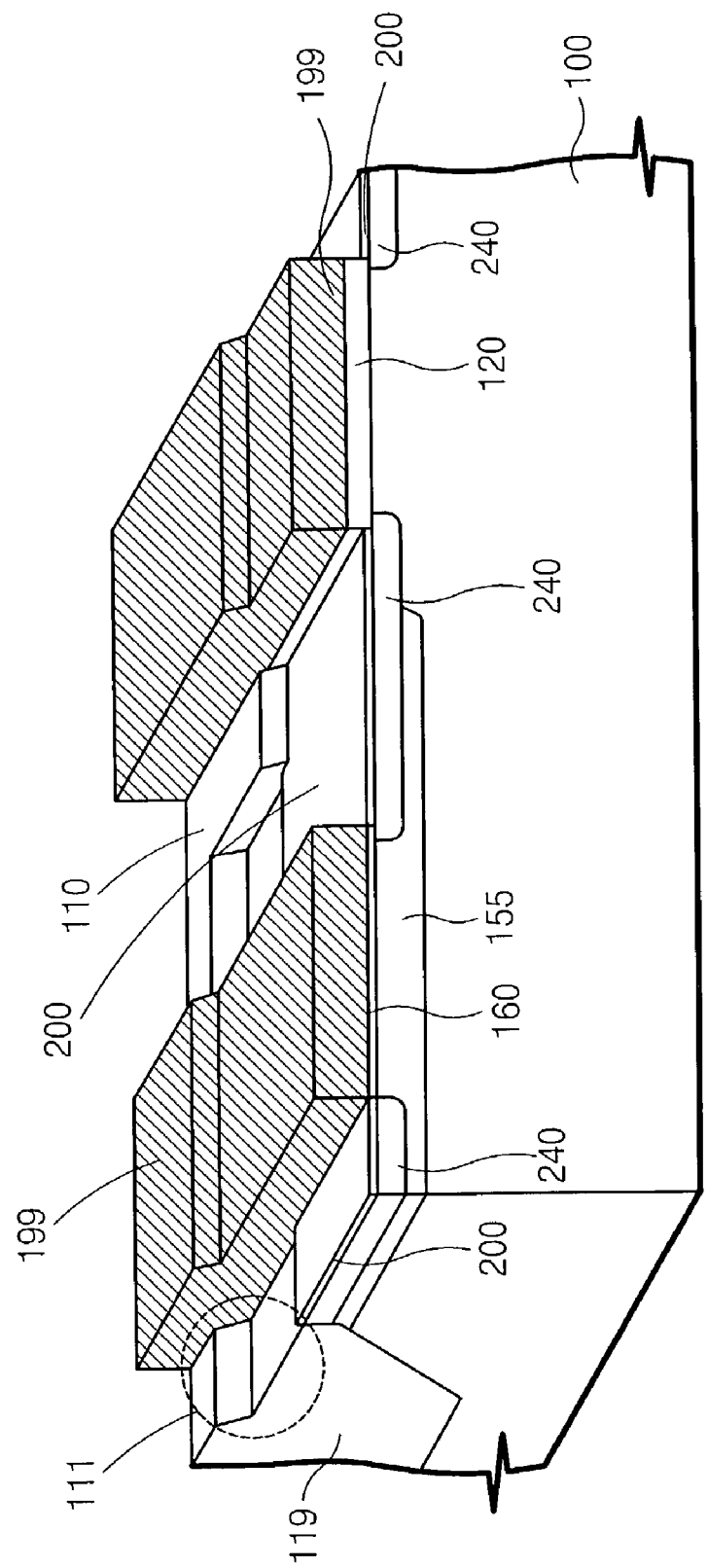
FIG. 8A is a perspective view of a Mask-ROM transistor according to an exemplary embodiment of the present invention.

FIGS. 5 and 6 are top plan views of EEPROM and Mask-ROM transistor structures, respectively, in accordance with an exemplary embodiment of the present invention. FIG. 7 is a perspective view of an EEPROM transistor according to an exemplary embodiment of the present invention; and FIGS. 8A and 8B are perspective views of a Mask-ROM transistor according to exemplary embodiments of the present invention.

The Mask-ROM transistor described in the exemplary embodiments of the present invention could include Mask-ROM configured as any of Page Mode Mask-ROM at 8M, 16M, 32M, 64M and 128M bits, for example; Standard Mask-ROM at 4M, 8M, 16M, 32M, 64M and 128M bits, for example; and Synchronous Mask-ROM at 64M bit, etc. However, the exemplary embodiments of the present invention are not limited to ROM at such sizes, as future, extended-size ROM is also foreseeable. The EEPROM transistor described hereafter may include EEPROM configured in any of 2K, 4K, 8K, 16K, 32K, 64K and 256K bit storage areas, for example, for up to or exceeding 1 million programming operations, with a write-in and data storage ability up to at least 100 years of more, it being understood that the exemplary embodiments of the invention are not limited to EEPROM in these storage area sizes or capabilities.

Referring to FIGS. 5 and 7, which describe layers of an EEPROM transistor in accordance with an exemplary embodiment, a device isolation layer 110 may be disposed at a given region of a semiconductor substrate 100 to define a cell active region. A sense line 230 and a selection line 235 may be disposed on the semiconductor substrate 100 and the device isolation 110, so as to cross over the cell active region and the device isolation layer 110.

The sense line 230 may be comprised of a floating gate 177, a gate interlayer dielectric 197 and a control gate 215, which may be sequentially stacked, for example. The floating gate 177 crosses over the cell active region. The floating gate 177 is not extended to the adjacent cell active region and stops at the device isolation layer 110. The gate interlayer dielectric 197 may cover the floating gates 177 and cross over the cell active region and device isolation layer 110. The floating gate 177 may be composed of polysilicon, and the gate interlayer dielectric 197 may be composed of oxide-nitride-oxide (ONO), for example, although other silicon-based components may be used for the floating gate 177, and the gate interlayer dielectric 197 may be composed of oxides other than ONO. The control gate 215 may be composed of a polysilicon pattern 216 and a silicide pattern 218, as shown in FIG. 7, for example, which may be sequentially stacked. An insulating layer (not shown) such as silicon oxide, silicon nitride or silicon oxynitride, for example, may be stacked over the silicide pattern 218.

The selection line 235 may include a lower selection gate 179, a selection gate interlayer dielectric 198 and an upper selection gate 225, which may be sequentially stacked, for example. The lower selection gate 179, selection gate interlayer dielectric 198 and upper selection gate 225 may each be composed of material layers having the same chemical constituent and thickness as the floating gate 177, gate interlayer dielectric 197 and control gate 215, respectively, for example. Accordingly, and similar to the control gate 215, the upper selection gate 225 may be comprised of a polysilicon pattern 226 and a silicide pattern 228, which may be sequentially stacked, as shown in FIG. 7. The lower and upper selection gates 179 and 225 may be electrically interconnected at a given region of the semiconductor substrate 100.

A tunnel insulating layer 160 may be interposed between the sense line 230 and the cell active region. The tunnel insulating layer 160 may have a thickness of about 12–150Å (Angstroms). A gate insulating layer 120, substantially surrounding the tunnel insulating layer 160, may be disposed on the cell active region to isolate the sense line 230 from the semiconductor substrate 100. The gate insulating layer 120 may also be interposed between the selection line 235 and the cell active region. At this time, the gate insulating layer 120 may be thicker than the tunnel insulating layer 160, and may have a thickness of about 200–400Å, for example.

A floating doped region 150 may be disposed at the cell active region under the tunnel insulating layer 160. The floating doped region 150 may be extended to the cell active region between the sense line 230 and selection line 235. However, the floating doped region 150 is not formed on the entire cell active region under the sense line 230. That is, a region excluding the floating doped region 150 is disposed within cell active region under the sense line 230, as shown in FIG. 7. This region may be configured as a channel region of the EEPROM cell transistor, for example. The floating doped region 150 includes impurities whose conductive type is different from that of impurities at the cell active region. An impurity concentration of the floating doped region 150 may be a concentration in a range from about $10^{18}$ to $10^{20}$ atoms/cm$^3$, for example.

Doped regions 240 may be disposed within the cell active region between adjacent sense lines 230, and within the cell active region between adjacent selection lines 235. The doped regions 240 may be used as a source and a drain of the EEPROM cell transistor, for example. Also, a high voltage doped region 245 may be disposed within cell active region between the sense and selection lines 230 and 235, as shown in FIG. 7, for example.

FIGS. 6 and 8A describe layers of a Mask-ROM transistor in accordance with an exemplary embodiment. Referring to FIGS. 6 and 8A, a device isolation layer 110 is disposed at a given region of the semiconductor substrate 100 to define a Mask-ROM active region. A Mask-ROM gate insulating layer may be disposed on the Mask-ROM active region, and may comprise a tunnel insulating layer 160 and a gate insulating layer 120, for example, which may be at different thicknesses, as shown in FIG. 8A. The Mask-ROM gate insulating layer may be composed of a silicon oxide layer having a different thickness according to a location on the semiconductor substrate 100. For example, the tunnel insulating layer 160 may have a thickness in a range of about 12–150Å, and the gate insulating layer 120 may have a thickness in a range of about 200–400Å.

A Mask-ROM gate 199 may be disposed on the Mask-ROM gate insulating layer to cross over the Mask-ROM active region and the device isolation layer 110. The Mask-ROM gate 199 may have the same chemical constituent and thickness as the floating gate 177 of the EEPROM cell transistor described in FIG. 7. A low voltage gate insulating layer 200, made of a silicon oxide layer, for example, may be disposed within the Mask-ROM active region, substantially around the Mask-ROM gate 199. The low voltage gate insulating layer 200 may be thinner than the gate insulating layer 120, but thicker than the tunnel insulating layer 160, for example.

A channel doped region 155 may be disposed within the Mask-ROM active region under the tunnel insulating layer 160, as shown in FIG. 8A. The channel doped region 155 may include impurities with a conductive type different from that of impurities within the Mask-ROM active region. Meanwhile, the channel doped region 155 is not disposed under the gate insulating layer 120. Accordingly, a threshold voltage of the Mask-ROM transistor may be varied depending on whether or not the channel doped region 155 is under the Mask-ROM gate 199. Utilizing a difference of the threshold voltage (based on the location of the channel doped region 155) is a principle of the Mask-ROM transistor in accordance with the exemplary embodiments of the invention. The channel doped region 155 may have the same depth, impurity concentration and impurity types as described with the floating doped region 150 of FIG. 7.

A recessed region 111 may be formed in device isolation layer 110 adjacent to the channel doped region 155, as shown in FIG. 8A. A top surface of the recessed region 111 may be lower (e.g., deeper) than a surface of the non-recessed device isolation layer 110, at least by an amount lower that is equal or greater than the thickness of the gate insulating layer 120. The non-recessed device isolation layer 110 may be disposed in a region on the semiconductor substrate 100 where the channel doped region 155 is not formed (i.e., a region adjacent to the gate insulating layer 120, for example). According to the exemplary embodiments of the present invention, the thickness of the Mask-ROM gate insulating layers 160 and 120 may be changed depending on whether or not there is a channel doped region 155. Furthermore, whether or not the recessed region 111 is formed at the device isolation layer 110 may be determined based on whether or not the channel doped region 155 is disposed substantially around the device isolation layer 110. In other words, the location of the channel doped region 155 controls thicknesses of Mask-ROM gate insulating layers 120 and 160, and where recessed regions 11 may be formed.

Doped regions 240 may be used as a source/drain of the Mask-ROM transistor. As shown in FIG. 8A, the doped regions may be disposed on the semiconductor substrate 100 between Mask-ROM gates 199, for example.

FIG. 8B is a perspective view showing a Mask-ROM transistor according to another exemplary embodiment of the present invention. The device isolation layer 110, channel doped region 155 and doped regions 240 in this exemplary embodiment mirror what was described in FIG. 8A, thus a more detailed explanation of these layers or regions is omitted.

Referring to FIGS. 6 and 8B, a Mask-ROM gate insulating layer 300 having a substantially uniform thickness may be disposed on the Mask-ROM active region defined by the device isolation layer 110. The Mask-ROM gate insulating layer 300 may be made of a silicon oxide layer having the same thickness as the low voltage gate insulating layer described in FIG. 8A, for example. A Mask-ROM gate 310 may be disposed so as to cross over the Mask-ROM active region and the device isolation layer 110. The Mask-ROM gate 310 may be formed of materials having the same thickness and chemical constituent as was described for the control gate 215 or the upper selection gate 225 of FIG. 7.

The channel doped region 155 of FIG. 8A may be disposed within a given region of the Mask-ROM active region. The Mask-ROM gate 310 may cross over the channel doped region 155, as shown in FIG. 8B for example. A recessed region 112 may be formed at the device isolation layer 110 adjacent to the channel doped region 155. A top surface of the recessed region 112 is lower than that of the recessed region 111. At this time, another recessed region 113 (to be shown and described in more detail below) may be formed at the device isolation layer 110 adjacent to a region where the channel doped region 155 is not present or formed. A top surface of this recessed region 113 may be lower (deeper) than that of the device isolation layer 110 at the cell active region, and a top surface of the recessed region 112 may be lower (deeper) than that of the recessed region 113, at least by an amount lower that is equal to or greater than the thickness of the gate insulating layer 120 of FIG. 7. Also, the top surface of recessed region 113 may be lower (deeper) than that of the device isolation layer 110 within the cell active region, at least by an amount lower that is equal to or greater than the thickness of the gate insulating layer 120 of FIG. 7.

Figure 18:
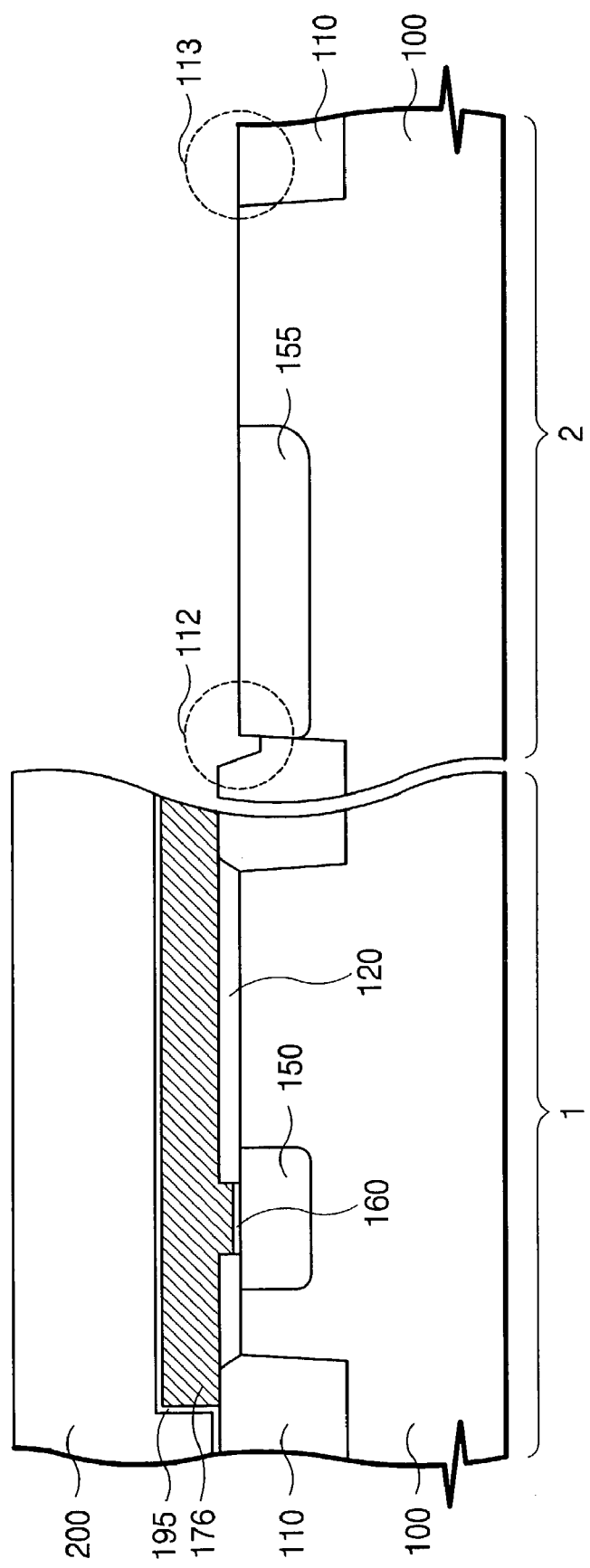
FIGS. 18 through 20 are cross-sectional views illustrating a method of fabricating a semiconductor device having EEPROM and Mask-ROM transistors according to another exemplary embodiment of the present invention.
Figure 19:
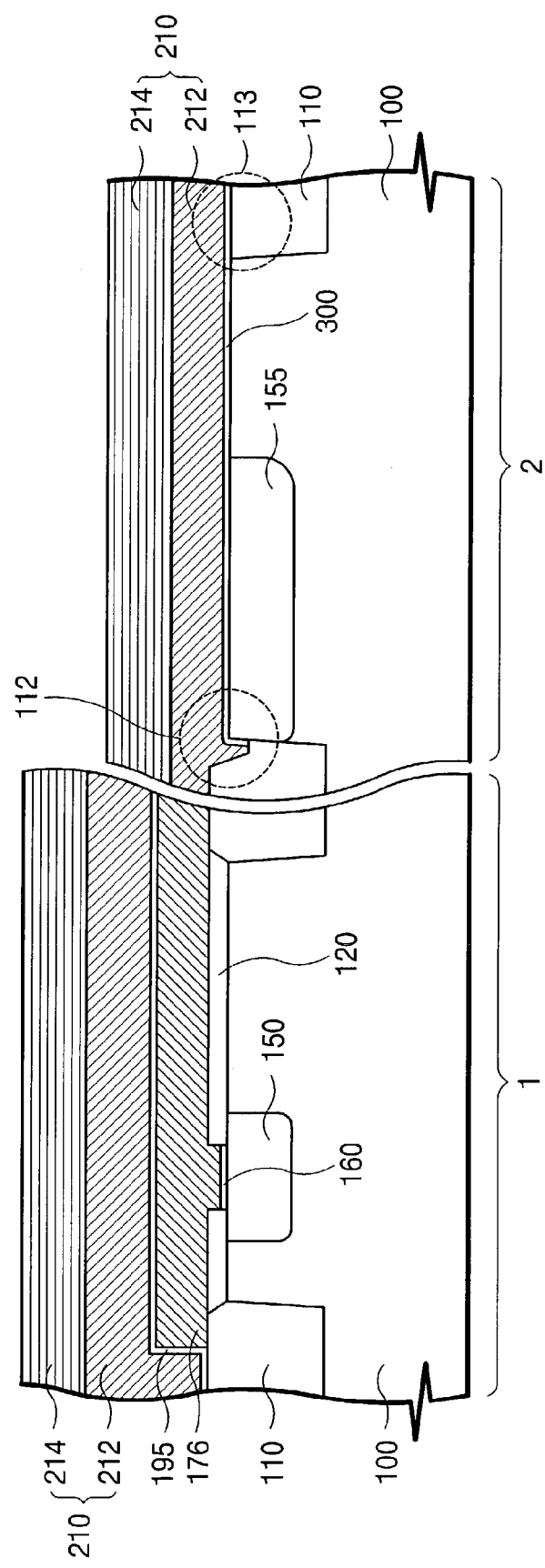
Figure 20:
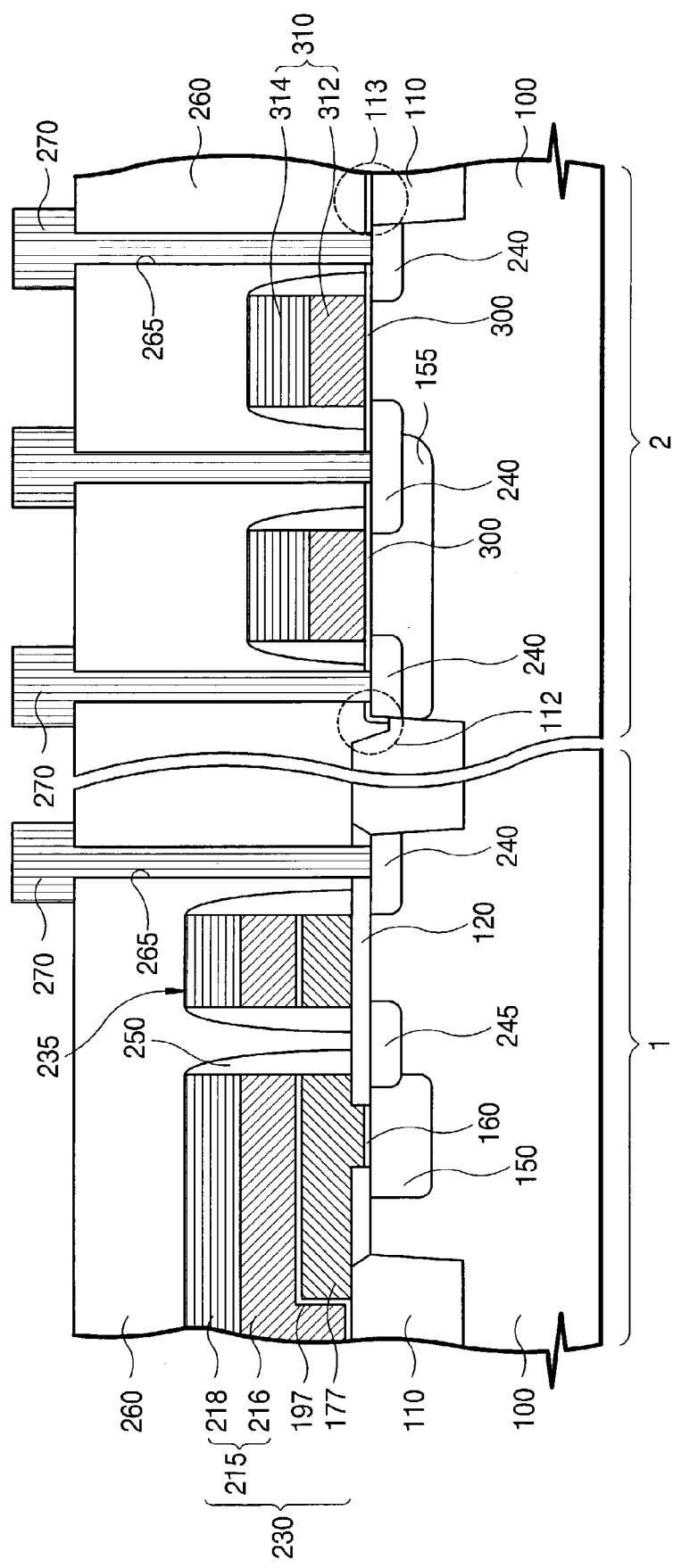

FIGS. 9 through 17 are cross-sectional views illustrating a method of fabricating a semiconductor device having an EEPROM cell transistor and a Mask-ROM transistor according to an exemplary embodiment of the present invention. FIGS. 18 through 20 are cross-sectional views illustrating a method of fabricating a semiconductor device having an EEPROM cell transistor and a Mask-ROM transistor according to another preferred embodiment of the present invention. As shown in FIGS. 9 through 20, on the basis of a cut line illustrated in the middle of drawings, a left side represents cross-sections shown, taken along a line I–I' of FIG. 5 and a right side represents cross-sections shown, taken along a line II–II' of FIG. 6. That is, FIGS. 9 through 20 represent cross-sections of an EEPROM cell transistor (left side) and a Mask-ROM transistor (right side), which are shown during the same process.

Figure 9:
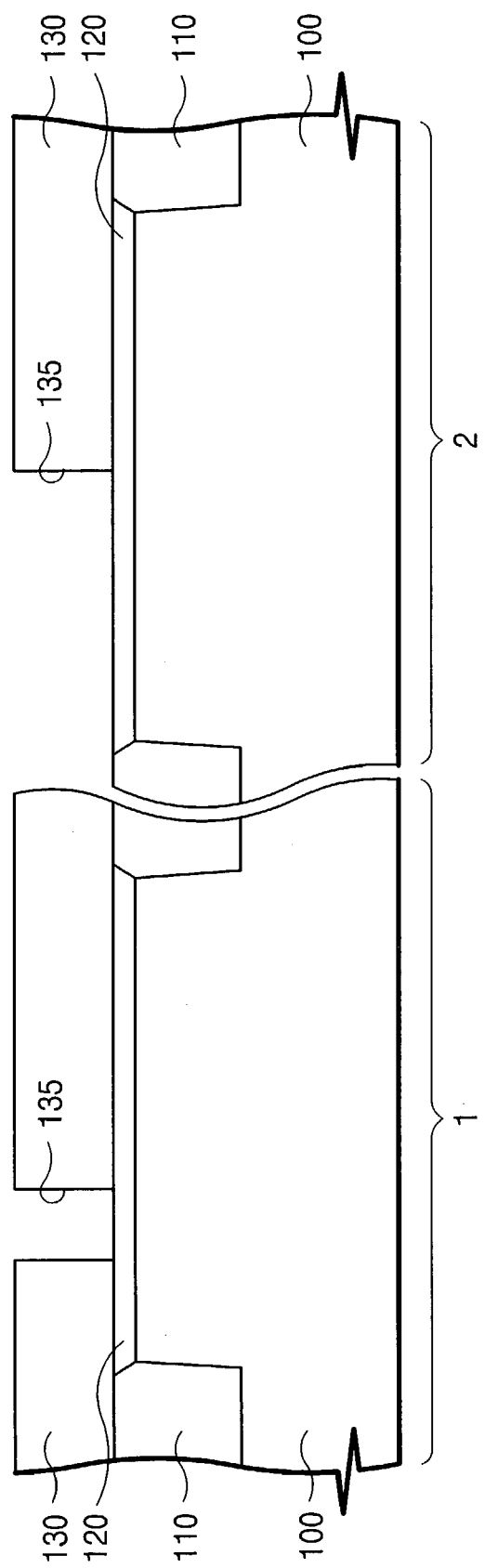
FIGS. 9 through 17 are cross-sectional views illustrating a method of fabricating a semiconductor device having EEPROM and Mask-ROM transistors according to an exemplary embodiment of the present invention.

Referring to FIGS. 5, 6 and 9, the device isolation layer 110 may be formed at a given region of the semiconductor substrate 100. The device isolation layer 110 defines a cell active region at a cell array region 1 and a Mask-ROM active region at a Mask-ROM region 2. EEPROM cell transistors of a Floating Gate Tunnel Oxide (FLOTOX) cell type, for example, may be formed at the cell array region 1. A plurality of Mask-ROM transistors may be formed at the Mask-ROM region 2. The device isolation layer 110 may be formed using a local oxidation of silicon (LOCOS) deposition process or a trench process, for example; however, other deposition methods may be used. Generally, the device isolation layer 110 may be formed so as to have a higher top surface than semiconductor substrate 100.

The gate insulating layer 120 may be formed so as to cover the cell active region and the Mask-ROM active region. The gate insulating layer 120 may be composed of a silicon oxide layer, for example, formed by a process of thermal-oxidizing the semiconductor substrate 100, or by other oxidation processes. The gate insulating layer 120 may have a thickness of about 200–300Å. A first photoresist pattern 130 may be formed on the semiconductor substrate 100 and gate insulating layer 120. The first photoresist pattern 130 may have an opening 135 exposing a given region within Mask-ROM region 2, as shown in FIG. 9.

The first photoresist pattern 130 may be used as a common mask defining a floating doped region, a channel doped region and a tunnel insulating layer, to be formed in subsequent processes. Accordingly, opening 135 is separated from device isolation layer 110 within cell array region 1 so as to expose only the gate insulating layer 120. However, the opening 135 formed in Mask-ROM region 2 exposes both the gate insulating layer 120 and the device isolation layer 110, which is adjacent to the gate insulating layer 120.

Figure 10:
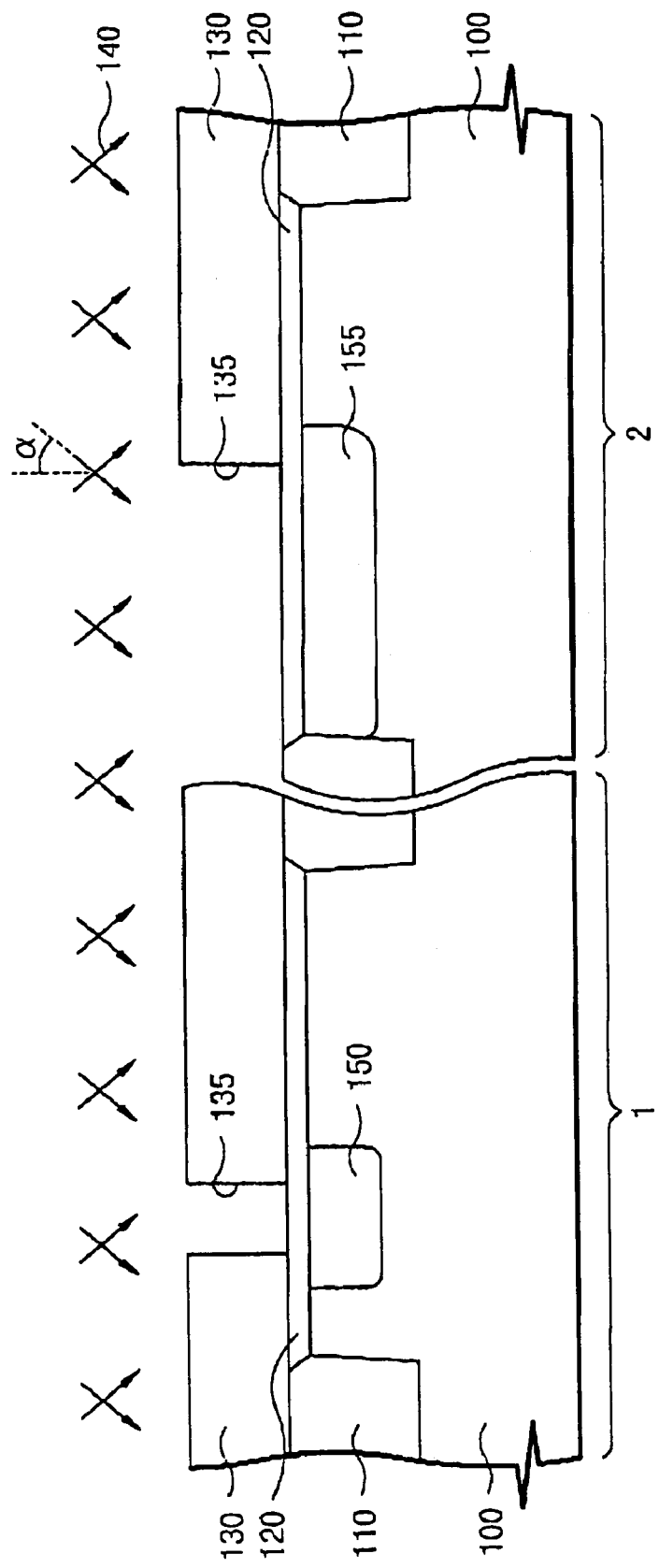

Referring to FIGS. 5, 6 and 10, a first ion implantation process (shown by arrows 140) may be performed using the first photoresist pattern 130 as a mask. Thus, the floating doped regions 150 may be formed within the cell active region, and channel doped regions 155 may be formed within the Mask-ROM active region, respectively. Locations of the floating and channel doped regions 150 and 155 may be determined by the location of opening 135.

The first ion implantation process may be performed with impurities of a conductive type that are different from those impurities within the cell active region and the Mask-ROM active region. Also, the first ion implantation process may be carried out so that an incidence angle of the implanted impurities, shown in FIG. 10 by "α," is in a range of about 7–45°, with respect to the semiconductor substrate 100. Accordingly, the floating doped region 150 may be wider than the width of the opening 135 of the cell active region. This width expansion phenomenon, due to the angle of incidence at which impurities are implanted, may also occur at the channel doped region 155.

Accordingly, the channel doped region 155 is locally formed at given location(s) within the Mask-ROM region, instead of over the entire Mask-ROM region. Since the Mask-ROM transistor is in an on-state or off-state depending on whether or not a channel doped region 155 is present beneath, the Mask-ROM transistor formed on the channel doped region 155 becomes a depletion mode MOSFET, which is generally in the on-state.

Figure 11:
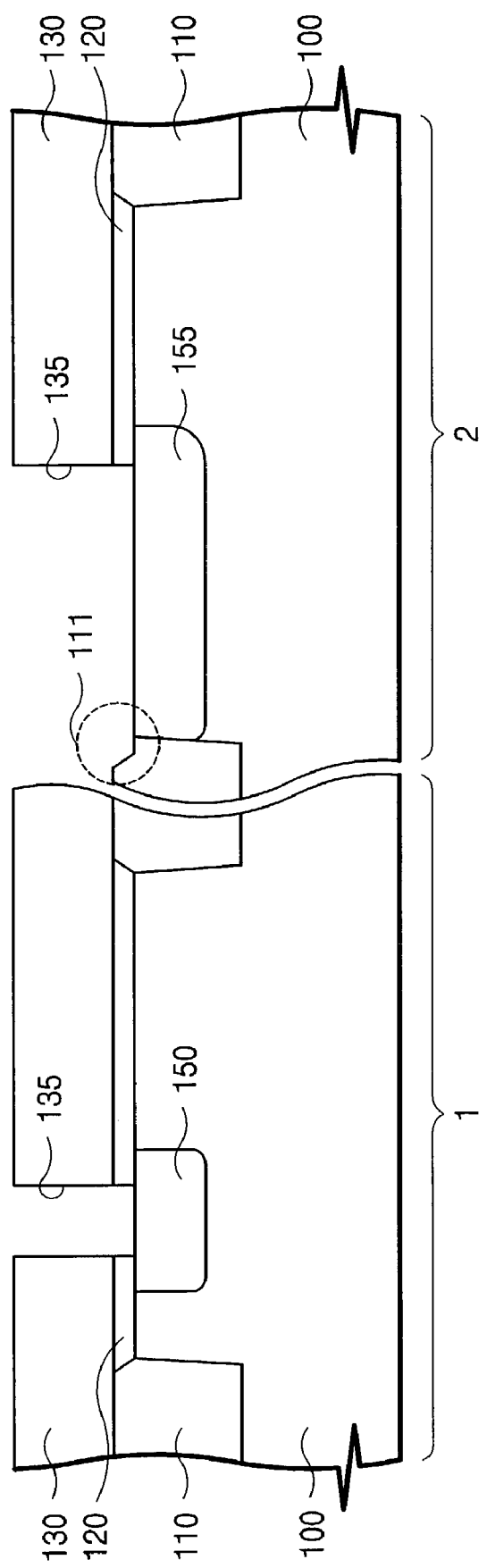

Referring to FIGS. 5, 6 and 11, the gate insulating layer 120 exposed through the opening 135 may be etched using the first photoresist pattern 130 as an etch mask so that the top surface of the floating and channel doped regions 150 and 155 may be exposed at the cell array region and the Mask-ROM region, respectively.

As described above, the opening 135 exposes the Mask-ROM active region as well as the top surface of the device isolation layer 110 adjacent to the channel doped region 155. Accordingly, when the gate insulating layer 120 is etched, the device isolation layer 110 (made of the same silicon oxide layer as the gate insulating layer 120) is also etched. As a result, the exposed portion(s) of the device isolation layer 110 may be recessed as much as an etch thickness of the gate insulating layer 120. This recessed portion is the recessed region 111 formed in the device isolation layer 110 adjacent to the channel doped region 155, as shown in FIG. 11. When an over-etch process is used, using an etch recipe with an etch selectivity. The etch selectivity may be defined as an etching characteristic showing a sufficient difference of etch rates to etch the reference film (semiconductor substrate 100) during etching of the target film (isolation layer 110), an etch thickness of the recessed region 111 may be thicker than that of the gate insulating layer 120.

Figure 12:
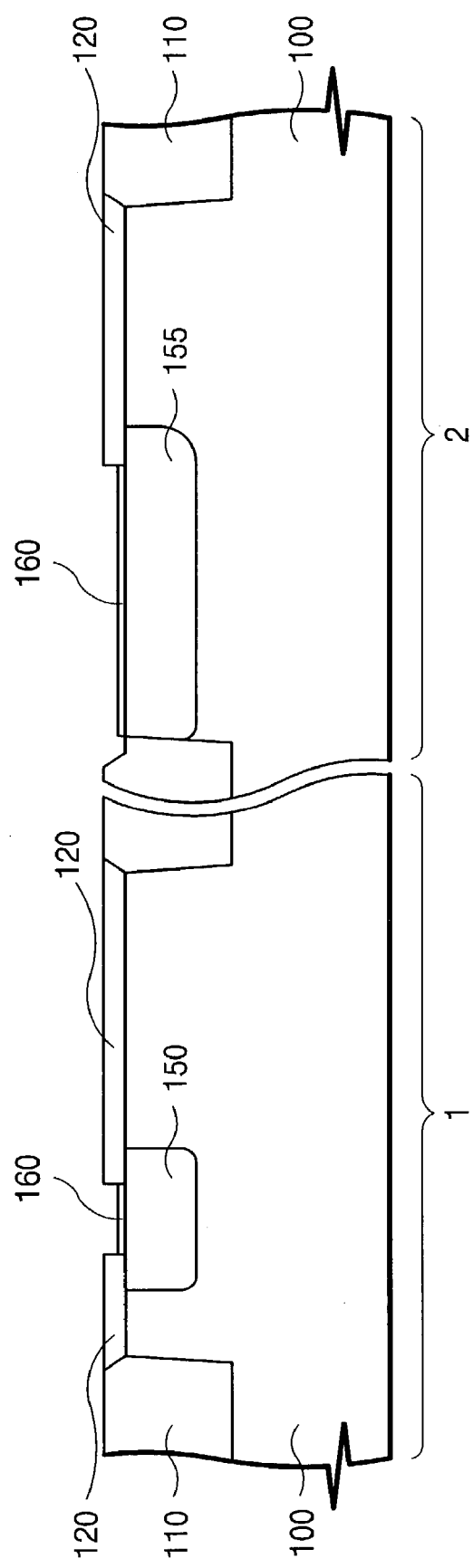

Referring to FIGS. 5, 6 and 12, the first photoresist pattern 130 may be removed to expose the device isolation layer 110 and the gate insulating layer 120. Thereafter, the tunnel insulating layer 160 may be formed on the exposed floating and channel doped regions 150 and 155. The tunnel insulating layer 160 may be composed of a silicon oxide layer formed by thermal oxidation, for example, and may have a thickness in a range of about 12–150 Å.

The tunnel and gate insulating layers 160 and 120 constitute the Mask-ROM gate insulating layer of the Mask-ROM region 2. The tunnel insulating layer 160 may be formed only on the channel doped region 155. The gate insulating layer 120 may cover the Mask-ROM active region where the channel doped region 155 is not present or not formed. Therefore, the Mask-ROM gate insulating layer may have a substantially non-uniform thickness, as shown in FIG. 12.

In addition, the first photoresist pattern 130 may be used as an ion implantation mask for forming the floating and channel doped regions 150 and 155, as well as an etch mask for forming the tunnel insulating layer 160. Thus, it is possible to reduce the number of process steps in the method in accordance with the exemplary embodiments of the invention, since only one mask is used, as compared to performing a photolithographic process two times and using two masks. Further, using the same mask may substantially reduce or prevent misalignments from occurring, as may occur when using multiple or different mask patterns. Exemplary embodiments of the present invention may provide a method which makes it possible to accurately align the tunnel insulating layer 160 at the floating doped region 150 so as to achieve a substantially uniform or uniform cell threshold voltage.

Additionally in the exemplary embodiments, the Mask-ROM gate insulating layer and the portion of the device isolation layer 110 within the Mask-ROM region may have different characteristics, depending on whether or not there is the channel doped region 155. Further, the Mask-ROM gate insulating layer is comprised of tunnel and gate insulating layers 160 and 120, each of which may be at a different thickness. Also, the location of the channel doped region 155 with respect to the device isolation layer determines where the recessed region 111 is to be formed.

Figure 13:
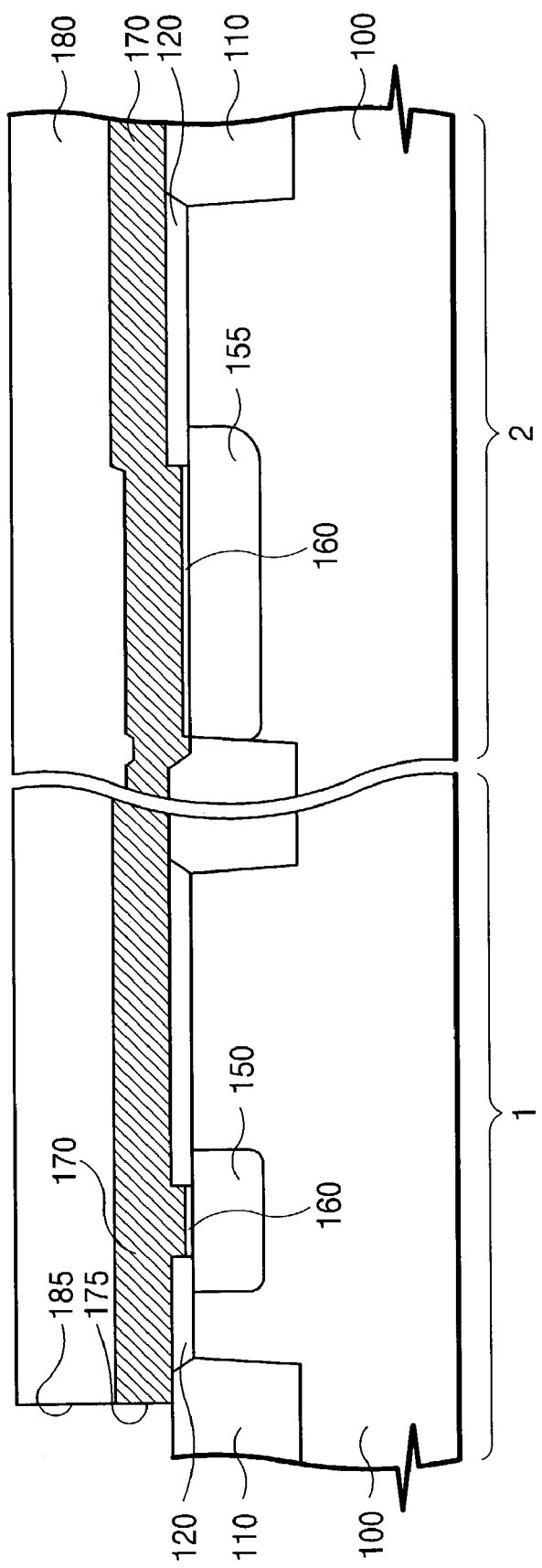

Referring to FIGS. 5, 6 and 13, a lower conductive layer 170 may be formed on the semiconductor substrate 100 and tunnel insulating layer 160. A second photoresist pattern 180, with an opening 185 exposing a given region of cell array region 1, may be formed on the lower conductive layer 170. At this time, the second photoresist pattern 180 covers an entire surface of the Mask-ROM region 2. Thereafter, the lower conductive layer 170 may be patterned using the second photoresist pattern 180 as an etch mask, so as to form an opening 175 exposing a top surface of the device isolation layer 110.

The lower conductive layer 170 may be made of the polysilicon, for example. Also, opening 175 may be equivalent to a pre-patterned region or opening for forming the floating gate of the EEPROM cell transistor. A floating gate has typically a quadrangle shape in-plane, so as to be isolated from different conductive patterns. The quadrangle shaped pattern may be constructed by forming the pre-patterned opening in one direction, and forming another opening, which is at right angle to the pre-patterned opening.

Figure 14:
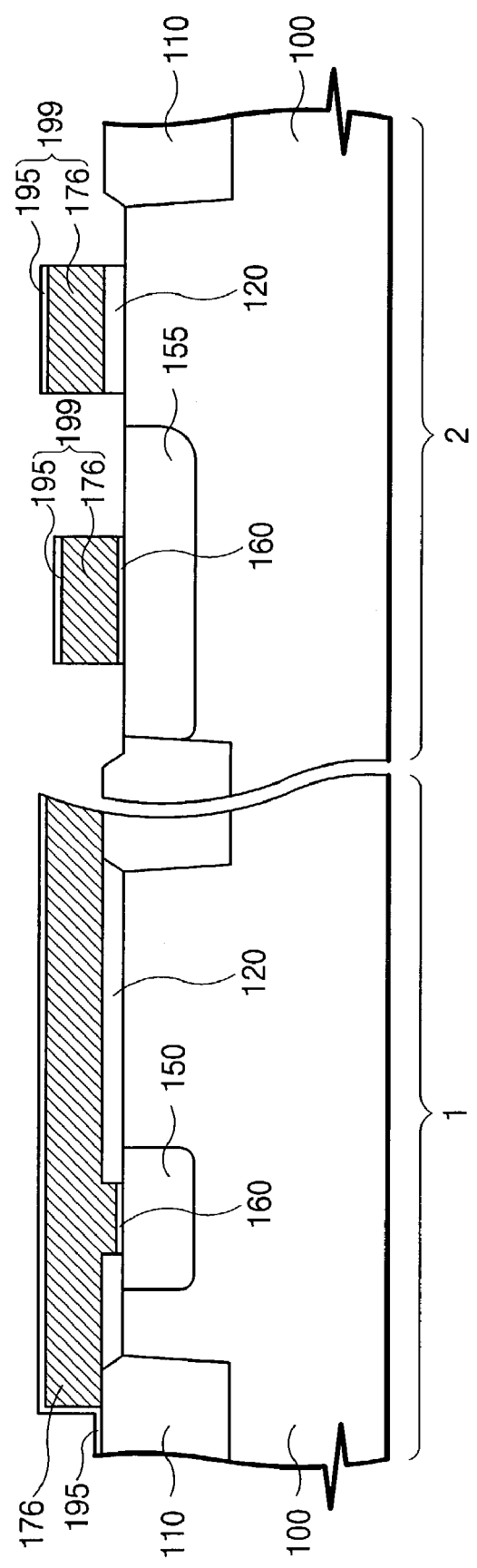

Referring to FIGS. 5, 6 and 14, the second photoresist pattern 180 may be removed to expose the lower conductive layer 170. A gate interlayer dielectric may be formed on the semiconductor substrate 100 and lower conductive layer 170, and may be composed of an oxide-nitride-oxide (ONO), for example.

A third photoresist pattern (not shown) may be formed on the gate interlayer dielectric to expose the gate interlayer dielectric at the Mask-ROM region 2. The third photoresist pattern may be used as an etch mask in a subsequent process of forming the Mask-ROM gate. The third photoresist pattern may cover an entire surface of the cell array region 1, for example.

The gate interlayer dielectric and the lower conductive layer 170 may be etched using the third photoresist pattern as the etch mask to form a lower conductive pattern 176 and a gate interlayer dielectric pattern 195. The lower conductive pattern 176 and gate interlayer dielectric pattern 195 may constitute the Mask-ROM gate 199 in the Mask-ROM region 2, as shown in FIG. 14. The Mask-ROM gate 199 crosses over the Mask-ROM active region and the device isolation layer 110. In order to form the Mask-ROM gate 199, an anisotropic etching process may be performed; it being understood that other etching processes may be used. Mask-ROM gate insulating layers besides the Mask-ROM gate 199 may be etched to expose the top surface of the Mask-ROM active region. In addition, the gate interlayer dielectric pattern 195 is not etched (see left side of FIG. 14), so as to cover the entire surface of the cell array region 1 during the etching process for forming the Mask-ROM gate 199.

Thereafter, the third photoresist pattern may be removed to expose the cell array region 1, covered with the gate interlayer dielectric pattern 195, and to expose the Mask-ROM gate 199, device isolation layer 110 and a top surface of the Mask-ROM active region within Mask-ROM region 2.

Figure 15:
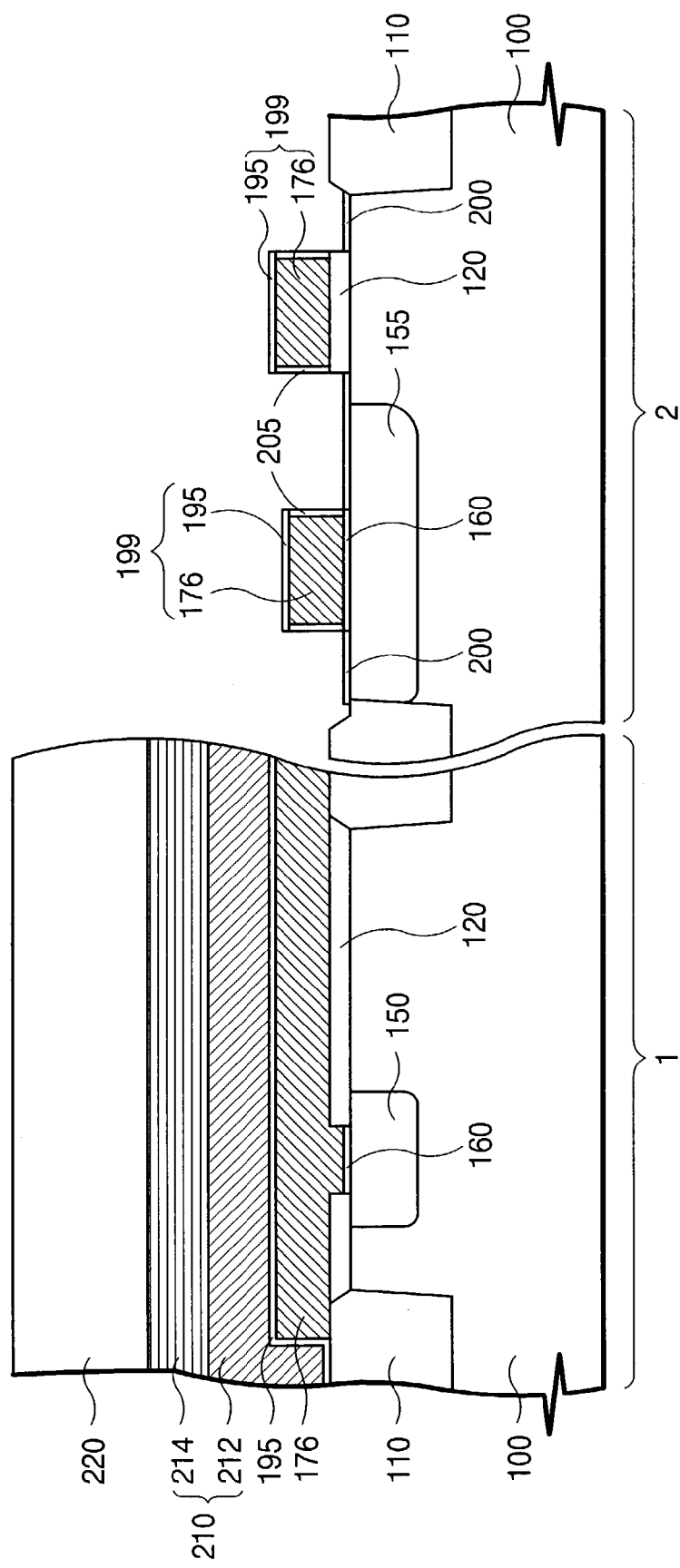

Referring to FIGS. 5, 6 and 15, a thermal oxidizing process may be performed on the resultant structure where the third photoresist pattern is removed. Accordingly, a low voltage gate insulating layer 200, made of a silicon oxide layer, for example, may be formed within the Mask-ROM active region, and a gate sidewall oxide layer 205 may be formed, simultaneously, on sidewalls of lower conductive pattern 176 of the Mask-ROM gate 199.

As shown in FIG. 15, an upper conductive layer 210 may be formed on the semiconductor substrate 100 where the thermal oxidizing process is performed. The upper conductive layer 210 may be comprised of a polysilicon pattern 212 and a silicide pattern 214, which may be sequentially stacked. Further, a material layer (not shown) consisting of a silicon oxide, silicon oxynitride or a silicon nitride layer may be formed on the silicide pattern 214.

A fourth photoresist pattern 220 may be formed on the upper conductive layer 210. An etching process may be performed using the fourth photoresist pattern 220 as an etch mask to remove the upper conductive layer 210 on the exposed Mask-ROM region 2. At this time, the fourth photoresist pattern 220 may cover the entire surface of the cell array region 1, as shown in FIG. 15, so that the upper conductive layer 210 in the cell array region 1 is not etched.

The upper conductive layer 210 may be removed using an anisotropic etching process in the Mask-ROM region 2. The upper conductive layer 210 may be composed of the same silicon as the lower conductive pattern 176 and semiconductor substrate 100, for example. In this case, the etching process may use an etch recipe having an improved etch selectivity with respect to the low voltage gate insulating layer 200, gate interlayer dielectric pattern 195 and device isolation layer 110, for example.

Figure 16:
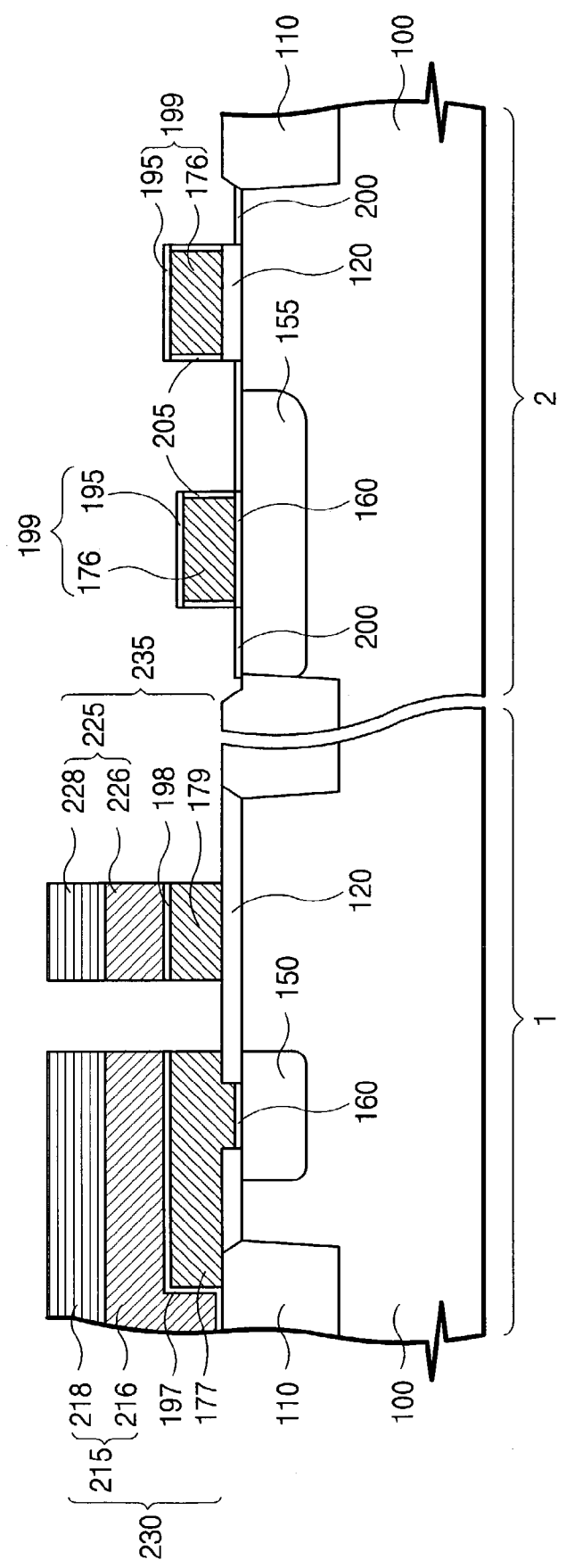

Referring to FIGS. 5, 6 and 16, the fourth photoresist pattern 220 may be removed to expose the upper conductive layer 210 in cell array region 1. Thereafter, the upper conductive layer 210, gate interlayer dielectric pattern 195 and lower conductive layer 176 may be patterned to form the sense lines 230 and selection lines 235 crossing over the cell active region and device isolation layer 110. The patterning process for forming the sense and selection lines 230 and 235 may be performed with another photoresist pattern covering the Mask-ROM region 2. The patterning process may be carried out such that the sense line 230 passes in or through the opening 175 of the lower conductive layer 170 of FIG. 13.

The sense line 230 may be comprised of the floating gate 177, gate interlayer dielectric 197 and control gate 215, which may be sequentially stacked, as shown in FIG. 16. The sense line 230 may be formed so as to cross over the floating doped region 150 and the tunnel insulating layer 160. The floating gate 177 may cover a top surface of the tunnel insulating layer 160 in the cell array region 1. Also, the floating gate 177 may cross the cell active region. The floating gate 177 stops at the device isolation layer 110, so as to have a quadrangle shape in plane. A cut region of the floating gate 177 may be determined by opening 175 of the lower conductive layer. The control gate 215 may be comprised of the polysilicon and silicide patterns 216 and 218, which may be sequentially stacked.

The selection line 235 may be comprised of the lower selection gate 179, selection gate interlayer dielectric 198 and the upper selection gate 225, which may be sequentially stacked, for example. Lower selection gate 179, selection gate interlayer dielectric 198 and upper selection gate 225 may have the same chemical constituent and thickness as the floating gate 177, cell gate interlayer dielectric 197 and control gate 215, respectively. In other words, the upper selection gate 225 may be comprised of the polysilicon and silicide patterns 226 and 228. Further, the lower and upper selection gates 179 and 225 may be electrically interconnected at a given region of the semiconductor substrate 100.

Figure 17:
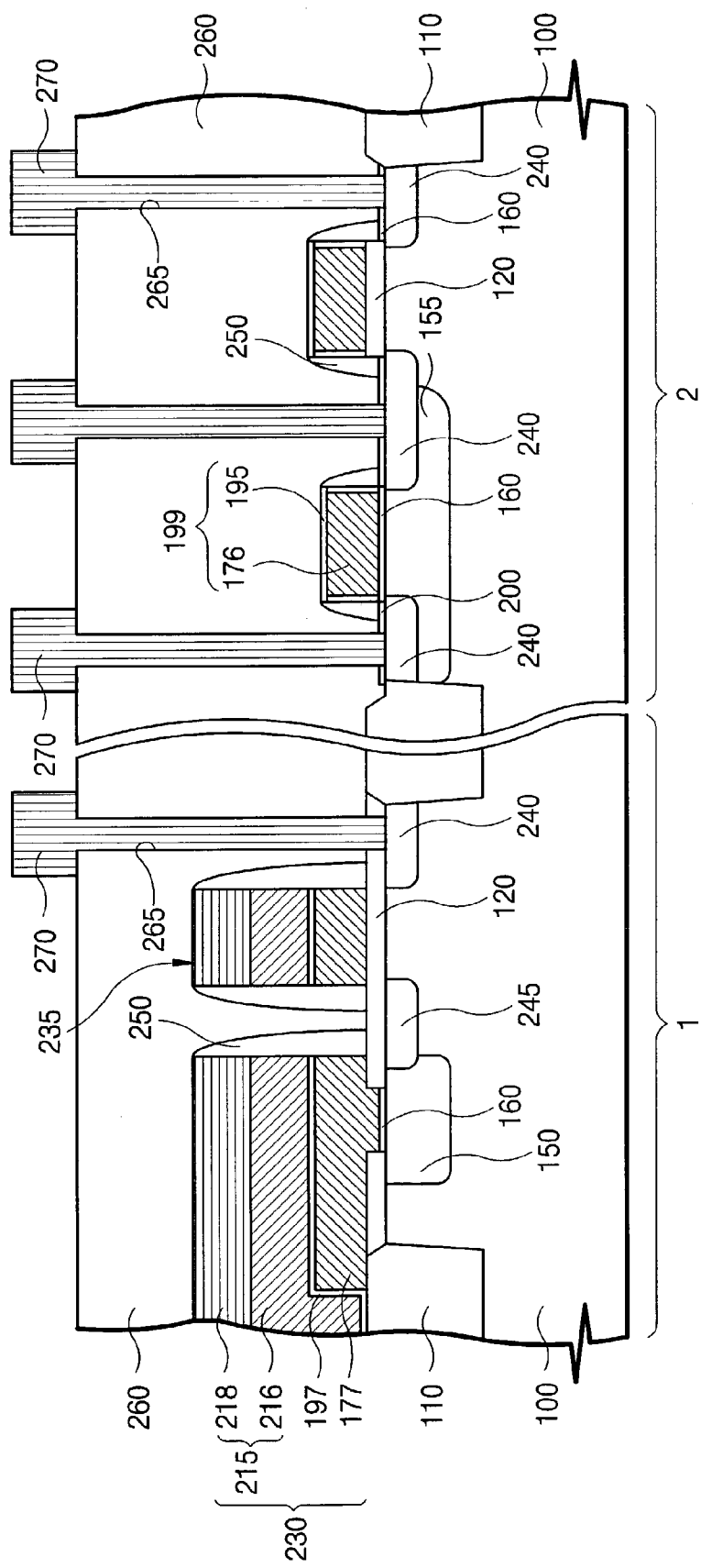

Referring to FIGS. 5, 6 and 17, a gate spacer 250 may be formed on sidewalls of the sense line 230, the selection line 235 and the Mask-ROM gate 199. Before or after the gate spacer 250 is formed, an ion implantation process may be performed for forming the doped regions 240 at given regions of the semiconductor substrate 100.

The doped regions 240 may be formed by one or more ion implantation process, using one of the sense line 230, selection line 235, Mask-ROM gate 199 or gate spacer 250 as a mask. Alternatively during the ion implantation process, another photoresist pattern may be used as the mask. The doped regions 240 may be configured as the source/drain region of the EEPROM cell and Mask-ROM transistors. In addition, the doped regions 240 may also include the high voltage doped region 245, which is formed in a typical EEPROM transistor. The high voltage doped region 245 may be formed at the cell active region between the selective and sense lines 235 and 230. The floating doped region 150 may be overlapped with the high voltage doped region 245 at given region(s) of the semiconductor substrate 100. Generally, the ion implantation process may be performed before forming the gate spacer 250, so as to have a low dose condition, as compared to performing the ion implantation process after forming the gate spacer 250.

After forming the doped regions 240, an interlayer dielectric 260 may be formed by a thermal oxidation process, for example, to cover the entire surface of the semiconductor substrate, including the gate spacer 250. An opening 265 exposing portions of the doped regions 240 may be formed through the interlayer dielectric 260. A contact/interconnection 270 may be formed with a suitable deposition process to connect to portions of the exposed doped regions 240, as shown in FIG. 17.

In the exemplary embodiment of FIG. 17, the Mask-ROM gate 199 has the same chemical constituent and thickness as the floating gate 177 of the sense line 230 (i.e., the lower conductive layer 170). Alternatively, in another exemplary embodiment of the invention, it is possible to use the upper conductive layer 210 as the Mask-ROM gate.

FIGS. 18 through 20 are cross-sectional views illustrating a method of fabricating a semiconductor device having EEPROM and Mask-ROM transistors according to another exemplary embodiment of the present invention. The method of forming the gate interlayer dielectric in this exemplary embodiment is similar to that described in the previous exemplary embodiment with respect to FIGS.

9–17. Furthermore, forming an EEPROM cell transistor in this exemplary embodiment is similar to that described in the previous exemplary embodiment. Accordingly, FIGS. 18–20, which illustrate modified parts from the previous exemplary embodiment, are described with repeated explanations omitted or minimized for convenience.

Referring to FIGS. 5, 6 and 18, the gate interlayer dielectric 197 and the lower conductive layer 170 may be patterned to expose the tunnel and gate insulating layers 160 and 120 at the cell active region 1. The patterning process may be performed using an etch recipe that has an etch selectivity with respect to a silicon oxide layer. A top surface of the device isolation layer 110 may also be exposed at the Mask-ROM region 2.

Thereafter, the tunnel and gate insulating layers 160 and 120 may be etched to expose the Mask-ROM active region. At this time, the device isolation layer 100 at the Mask-ROM region 2 is recessed at least as far as a thickness of the gate insulating layer 120. As a result, the device isolation layer 110 may contain a recessed region 112 and a recessed region 113. The recessed region 112 ("deep recessed region") is the region formed by further recessing the recessed region 111 described in FIG. 11, for example. However, recessed region 113 ("shallow recessed region") is the region that was not etched during an etching process of the gate insulating layer 120 for forming the tunnel insulating layer 160.

Referring to FIGS. 5, 6 and 19, a Mask-ROM gate insulating layer 300 may be formed on the exposed Mask-ROM active region. The Mask-ROM gate insulating layer 300 may be composed of a silicon oxide layer formed by a thermal oxidization process, for example. The Mask-ROM gate insulating layer 300 is a low voltage gate insulating layer, which is a gate insulating layer of low voltage transistors, and which may be configured at a peripheral circuit region of the Mask-ROM transistor for operating the EEPROM cell transistor.

The upper conductive layer 210 may formed on an entire surface of the semiconductor substrate 100 and Mask-ROM gate insulating layer 300. The upper conductive layer 210 is substantially identical to the upper conductive layer 210 of FIG. 15, and is comprised of polysilicon pattern 212 and silicide pattern 214. Polysilicon pattern 212 and silicide pattern 214 may be sequentially stacked as shown in FIG. 19, and may include an insulating layer (not shown) formed thereon.

In addition, the Mask-ROM gate insulating layer 300 may be formed after removing the gate insulating layer 120. Thus, the Mask-ROM gate insulating layer 300 has a substantially uniform or uniform thickness, unlike the Mask-ROM gate insulating layer of the previous exemplary embodiment as described in FIG. 12.

Referring to FIGS. 5, 6 and 20, the upper conductive layer 210 may be patterned to form a Mask-ROM gate 310 comprised of a polysilicon pattern 312 and a silicide pattern 314. Preferably, the patterning process for forming the sense and selection lines 230 and 235, described previously with reference to FIG. 16, may be used in order to form the Mask-ROM gate 310.

The process steps after forming the sense and selection lines 230 and 235 (i.e., forming the gate spacer 250, the doped regions 245 and 240, the interlayer dielectric 260 and the contact/interconnection 270) are substantially identical to those of the previous exemplary embodiment, thus a detailed discussion is omitted.

According to the exemplary embodiments of the present invention, the floating doped region and the tunnel insulating layer may be formed using the same photoresist pattern. Thus, it may be possible to substantially reduce or prevent the tunnel insulating layer from being misaligned with the floating doped region, when forming an EEPROM cell transistor. As a result, a semiconductor device including the EEPROM with a substantially uniform or uniform threshold voltage characteristic may be fabricated.

Additionally, the floating doped region and the tunnel insulating layer may be formed using the same photoresist pattern in order to reduce the number of photolithographic processes required, potentially decreasing manufacturing costs. Although the exemplary embodiments have described a semiconductor device including Mask-ROM transistors, for coding a program embedded on a smart card, for example, it should be understood that ROM transistors other than Mask-ROM transistors may be employed. Additionally, although EEPROM has been used as the nonvolatile memory in the exemplary embodiments of the present invention, it should be understood that ROM transistors other than EEPROM may be employed as nonvolatile memory transistors for writing and storing user information and transaction information on a smart card, for example. Further, the exemplary embodiments of the present invention may also be applied to semiconductor devices other than smart cards, and could be adapted for use in LAN cards, Router applications, sound cards, game cards, etc.

While the present invention has been particularly shown and described with reference to exemplary embodiments thereof, it will be understood by those of ordinary skill in the art that various changes in form and details may be made therein without departing from the spirit and scope of the exemplary embodiments of the present invention as defined by the following claims.

What is claimed is:

1. A method of fabricating a semiconductor device, comprising:
   forming a device isolation layer on a semiconductor substrate, the device isolation layer defining a cell active region and a Mask-ROM active region;
   forming a gate insulating layer on the semiconductor substrate;
   forming a first photoresist pattern on the gate insulating layer, the first photoresist pattern including an opening exposing portions of the gate insulating layer;
   forming a floating doped region within the cell active region under the opening by using the first photoresist pattern;
   exposing the floating doped region using the first photoresist pattern;
   removing the first photoresist pattern; and
   forming a tunnel insulating layer on the exposed floating doped region.

2. The method as claimed in claim 1, wherein said forming a gate insulating layer further includes forming the gate insulating layer simultaneously at the cell active region and the Mask-ROM active region.

3. The method as claimed in claim 1, wherein
   said forming a gate insulating layer further includes forming the gate insulating layer of silicon oxide by thermal oxidizing the semiconductor substrate, and
   said forming a tunnel insulating layer further includes forming the tunnel insulating layer of silicon oxide by thermal oxidizing the semiconductor substrate.

4. The method as claimed in claim 1, wherein the tunnel insulating layer is thinner than the gate insulating layer.

5. The method as claimed in claim 1, wherein said forming a first photoresist pattern further includes forming the first photoresist pattern so as to expose portions of the gate insulating layer within the cell active region, and to expose portions of the gate insulating layer and device isolation layer within the Mask-ROM active region.

6. The method as claimed in claim 5, further comprising:
forming a channel doped region at the Mask-ROM active region by using the first photoresist pattern as an ion implantation mask during said forming of the floating doped region.

7. The method as claimed in claim 6, further comprising:
exposing the channel doped region by using the first photoresist pattern as an etch mask during said exposing of the floating doped region.

8. The method as claimed in claim 7, wherein said forming a tunnel insulating layer further includes simultaneously forming the tunnel insulating layer on the exposed channel doped region and the exposed floating doped region.

9. The method as claimed in claim 5, wherein said exposing the floating doped region further includes etching the exposed portions of the gate insulating layer and device isolation layer.

10. The method as claimed in claim 9, wherein said etching the exposed portions further includes etching the device isolation layer so that a top surface of the device isolation layer, in an exposed portion through the opening of the first photoresist pattern, is lower as compared to a portion of the device isolation layer covered by the first photoresist pattern.

11. The method as claimed in claim 1, further comprising:
forming a sense line that crosses the cell active region;
forming a selection line that crosses the cell active region; and
forming a Mask-ROM gate that crosses the Mask-ROM active region, each forming of sense line, selection line and Mask-ROM gate performed after forming the tunnel insulating layer.

12. The method as claimed in claim 11, wherein said forming a sense line and forming a selection line each further comprise:
forming a lower conductive layer on the semiconductor substrate where the tunnel insulator is formed;
patterning the lower conductive layer to form the opening that exposes the top surface of the device isolation layer;
forming a gate interlayer dielectric covering the entire surface of the semiconductor substrate where the opening is formed;
forming an upper conductive layer on the gate interlayer dielectric layer; and
patterning the upper conductive layer, gate interlayer dielectric and lower conductive layer to form the sense line and selection line,
wherein the sense line passes the opening.

13. The method as claimed in claim 12, wherein forming the Mask-ROM gate further includes patterning the gate interlayer dielectric and the lower conductive layer to expose a top surface of the Mask-ROM active region before forming the upper conductive layer.

14. The method as claimed in claim 13, further comprising:
forming a low voltage gate oxide layer on the exposed Mask-ROM active region after patterning the lower conductive layer.

15. The method as claimed in claim 14, further comprising:

removing the upper conductive layer in the active Mask-ROM region so that the low voltage gate oxide layer is exposed.

16. The method as claimed in claim 15, wherein said removing the upper conductive layer at the Mask-ROM region further includes using an anisotropic etching process having an etch selectivity with respect to the patterned gate interlayer dielectric and the low voltage gate oxide layer.

17. The method as claimed in claim 13, wherein said forming the Mask-ROM gate further includes:
exposing the top surface of the Mask-ROM active region before forming the upper conductive layer;
forming the low voltage gate oxide layer on the exposed Mask-ROM active region;
forming the upper conductive layer on the semiconductor substrate where the low voltage gate oxide layer is formed; and
patterning the upper conductive layer to form an upper conductive pattern crossing the Mask-ROM active region.

18. The method as claimed in claim 17, wherein said exposing the Mask-ROM active region further includes forming a recess in a portion of the device isolation layer within the Mask-ROM region.

19. The method as claimed in claim 17, wherein the upper conductive layer is patterned when the sense line and the selection line are formed.

20. The method as claimed in claim 1, wherein said forming a floating doped region doped further includes performing a first impurity implantation process using the first photoresist pattern as an ion implantation mask to form the floating doped region within the cell active region under the opening.

21. The method as claimed in claim 20, wherein said performing the first impurity implantation process further includes using an ion implantation process to implant an impurity with an inclination angle into the semiconductor substrate.

22. The method as claimed in claim 1, wherein said exposing the floating doped region using the first photoresist pattern further includes etching the exposed gate insulating layer using the first photoresist pattern as an etch mask to expose the floating doped region.

23. A semiconductor device, comprising:
a device isolation layer formed at given regions of a semiconductor substrate to define a cell active region and a Mask-ROM active region including a channel doped region therein;
a plurality of Mask-ROM gates crossing the channel doped region; and
a Mask-ROM gate insulating layer interposed between a Mask-ROM gate and the Mask-ROM active region,
the device isolation layer having a surface adjacent to the channel doped region that is lower as compared to a surface of the device isolation layer that is not directly adjacent to the channel doped region; the semiconductor device formed by the method of claim 1.

24. A method of fabricating a semiconductor device, comprising:
forming a device isolation layer on a semiconductor substrate, the device isolation layer including a cell array region defining a cell active region and a Mask-ROM region defining a Mask-ROM active region;
forming a gate insulating layer on the semiconductor substrate;

forming a photoresist pattern with an opening exposing portions of the gate insulating layer on the semiconductor substrate;

forming a floating doped region within the cell active region and a channel doped region within the Mask-ROM active region with an ion implantation process that uses the photoresist pattern as a mask;

etching the exposed gate insulating layer using the photoresist pattern as an etch mask to expose the floating doped region and the channel doped region;

removing the photoresist pattern;

forming a tunnel insulating layer on the exposed floating doped region and the exposed channel doped region;

forming a sense line crossing the cell active region, a selection line crossing the cell active region, and a Mask-ROM gate crossing the Mask-ROM active region the semiconductor substrate where the tunnel insulating layer is formed.

25. A semiconductor device comprising:
a device isolation layer formed at given regions of a semiconductor substrate to define a cell active region and a Mask-ROM active region including a channel doped region therein;
a plurality of Mask-ROM gates crossing the channel doped region; and
a Mask-ROM gate insulating layer interposed between a Mask-ROM gate and the Mask-ROM active region,
the device isolation later having a surface adjacent to the channel doped region that is lower as compared to a surface of the device isolation layer that is not directly adjacent to the channel doped region, the semiconductor device formed by the method of claim 24.

26. A method of forming a semiconductor device, comprising:
forming an isolation layer on a semiconductor substrate;
forming a first insulating layer on the semiconductor substrate;
forming a photoresist pattern on the first insulating layer, the photoresist pattern including an opening exposing portions of the first insulating layer and isolation layer;
forming a floating doped region beneath the opening using the photoresist pattern;
etching the first insulating layer using the photoresist pattern to form exposed portions;
removing the photoresist pattern; and
forming a second insulating layer on the exposed portions.

27. The method of claim 26, wherein a top surface of the isolation layer, in one of the exposed portions through the opening of the photoresist pattern, is lower as compared to a portion of the isolation layer covered by the photoresist pattern.

28. The method of claim 27, further comprising:
forming a sense line crossing the cell active region, a selection line crossing the cell active region, and a Mask-ROM gate crossing the Mask-ROM active region on the semiconductor substrate where the second insulating layer is formed.

29. The method of claim 26, wherein the isolation layer defines a cell active region and an Mask-ROM active region, the method further comprising:
forming the floating doped region within the cell active region; and
forming a channel doped region within the Mask-ROM active region, each forming of floating doped and channel doped regions performed with an ion implantation process that uses the first photoresist pattern as a mask.

30. A semiconductor device, the semiconductor device formed by the method of claim 26.

31. A method of fabricating a semiconductor device, comparing:
forming a device isolation layer on a semiconductor substrate, the device isolation layer defining a cell active region and a Mask-ROM active region;
forming a gate insulating layer on the semiconductor substrate;
forming a first photoresist pattern on the gate insulating layer, the first photoresist pattern including an opening exposing portions of the gate insulating layer wherein said forming a first photoresist pattern further includes forming the first photoresist pattern so as to expose portions of the gate insulating layer within the cell active region, and to expose portions of the gate insulating layer and the device isolation layer within the Mask-ROM active region;
forming a floating doped region within the cell active region under the opening by using the first photoresist pastern;
exposing the floating doped region using the first photoresist pattern;
removing the first photoresist pattern; and
forming a tunnel insulating layer on the exposed floating doped region.

* * * * *